(12) United States Patent
Kakegawa

(10) Patent No.: US 8,574,996 B2
(45) Date of Patent: Nov. 5, 2013

(54) METHOD OF MANUFACTURING SEMICONDUCTOR DEVICE

(75) Inventor: Tomoyasu Kakegawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/533,534

(22) Filed: Jun. 26, 2012

(65) Prior Publication Data

US 2013/0005113 A1    Jan. 3, 2013

(30) Foreign Application Priority Data

Jun. 30, 2011   (JP) ................................ 2011-145126

(51) Int. Cl.
*H01L 21/20* (2006.01)
(52) U.S. Cl.
USPC .................................. 438/382; 257/E47.005
(58) Field of Classification Search
USPC .................................. 438/382; 257/E47.005
See application file for complete search history.

(56) References Cited

U.S. PATENT DOCUMENTS

2013/0078778 A1*  3/2013  Chien et al. ................... 438/296
2013/0089984 A1*  4/2013  Raghunathan et al. ........ 438/696

FOREIGN PATENT DOCUMENTS

JP          2001-156283         6/2001

* cited by examiner

*Primary Examiner* — David S Blum
(74) *Attorney, Agent, or Firm* — Young & Thompson

(57) ABSTRACT

A method of manufacturing a semiconductor device comprises: forming a processing target; forming a first supporter on the processing target; forming a first mask so as to contact one side surface of the first mask with a side surface of the first supporter; patterning the processing target using, as masks, the first mask and the first supporter; forming a second supporter so as to be contacted with a side surface of the processing target exposed in first processing step and the other side surface of the first mask; removing the first supporter; and patterning the processing target using, as masks, the first mask and the second supporter.

20 Claims, 22 Drawing Sheets

(Z)  (X)  (Y)

(Z)    (X)    (Y)

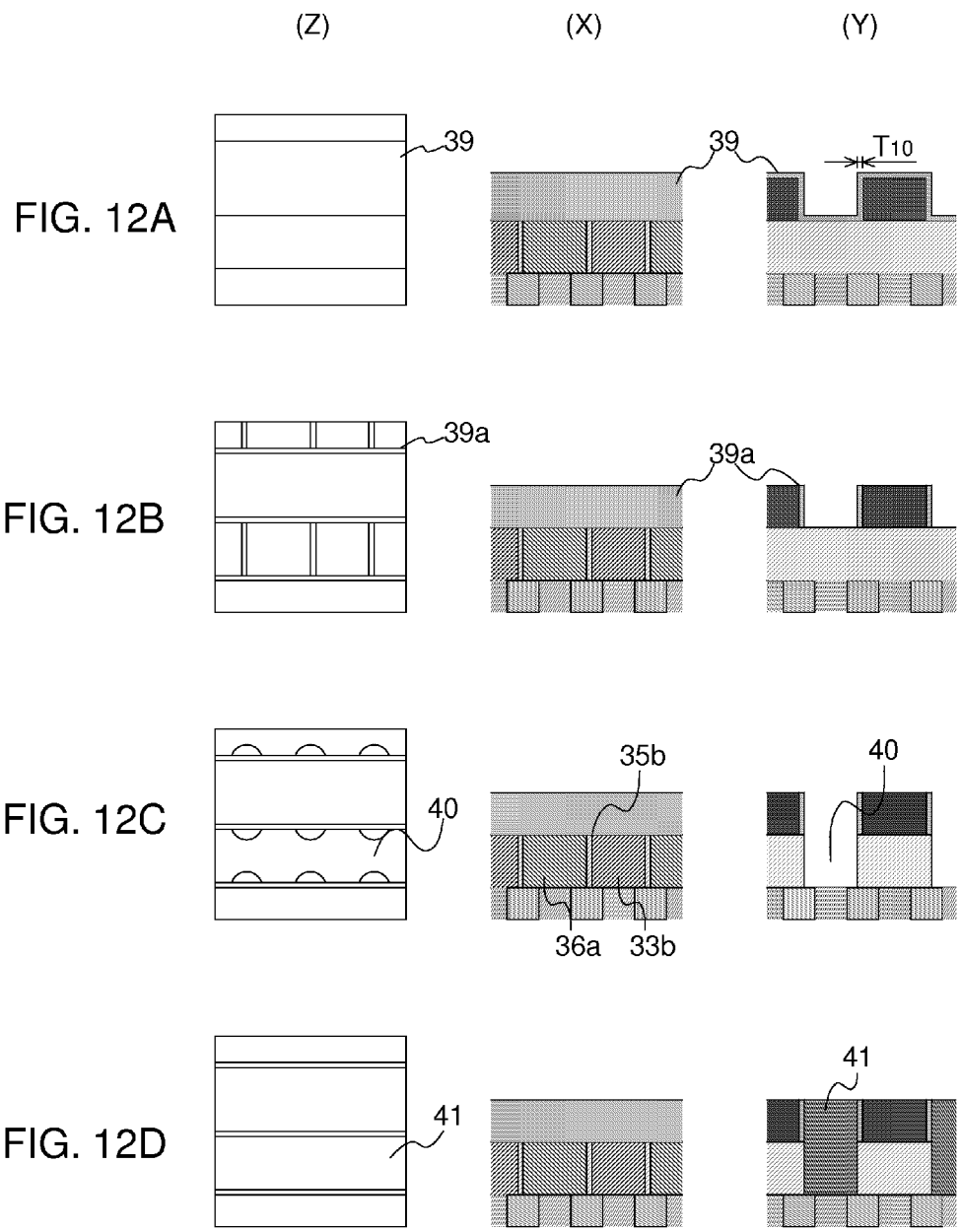

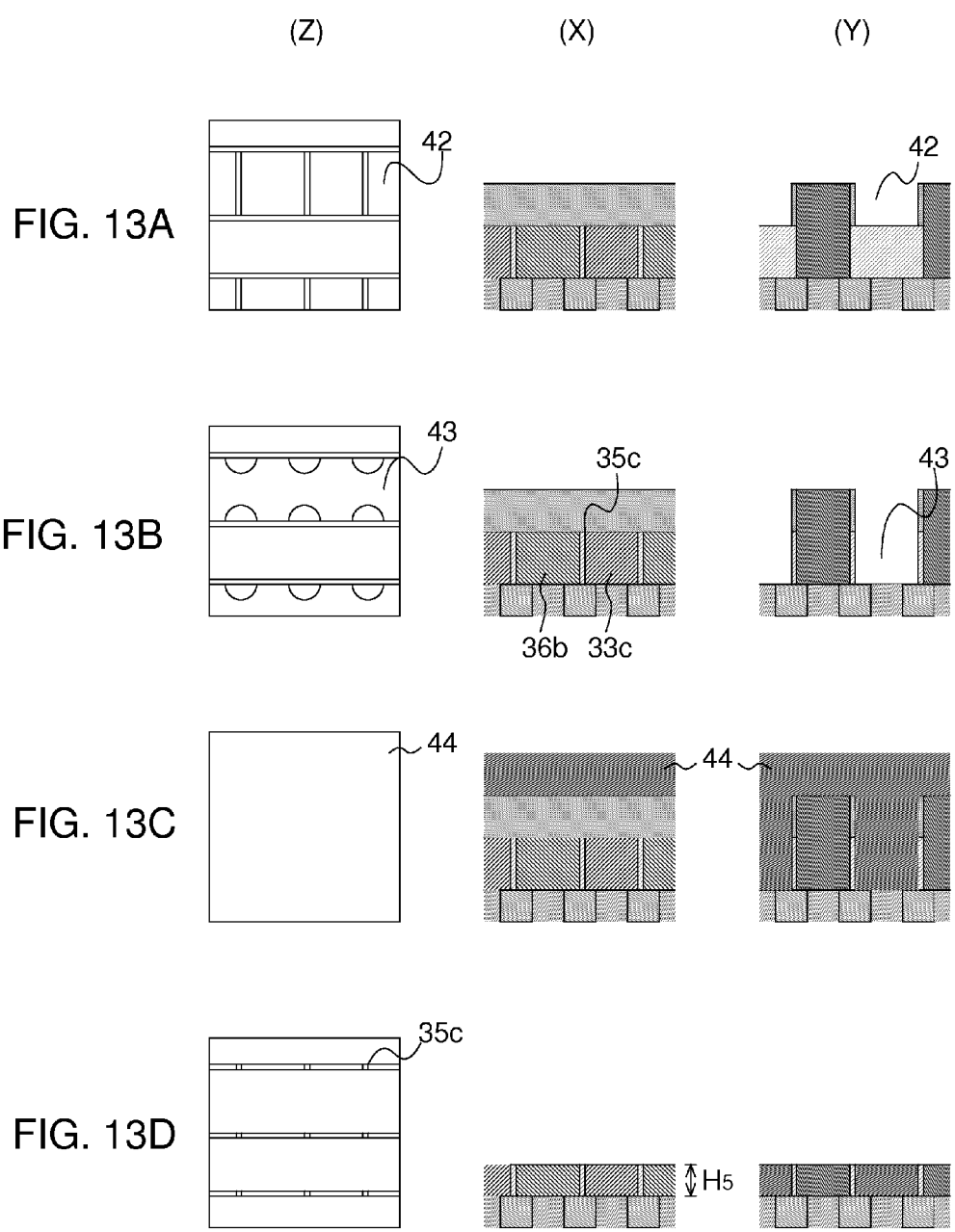

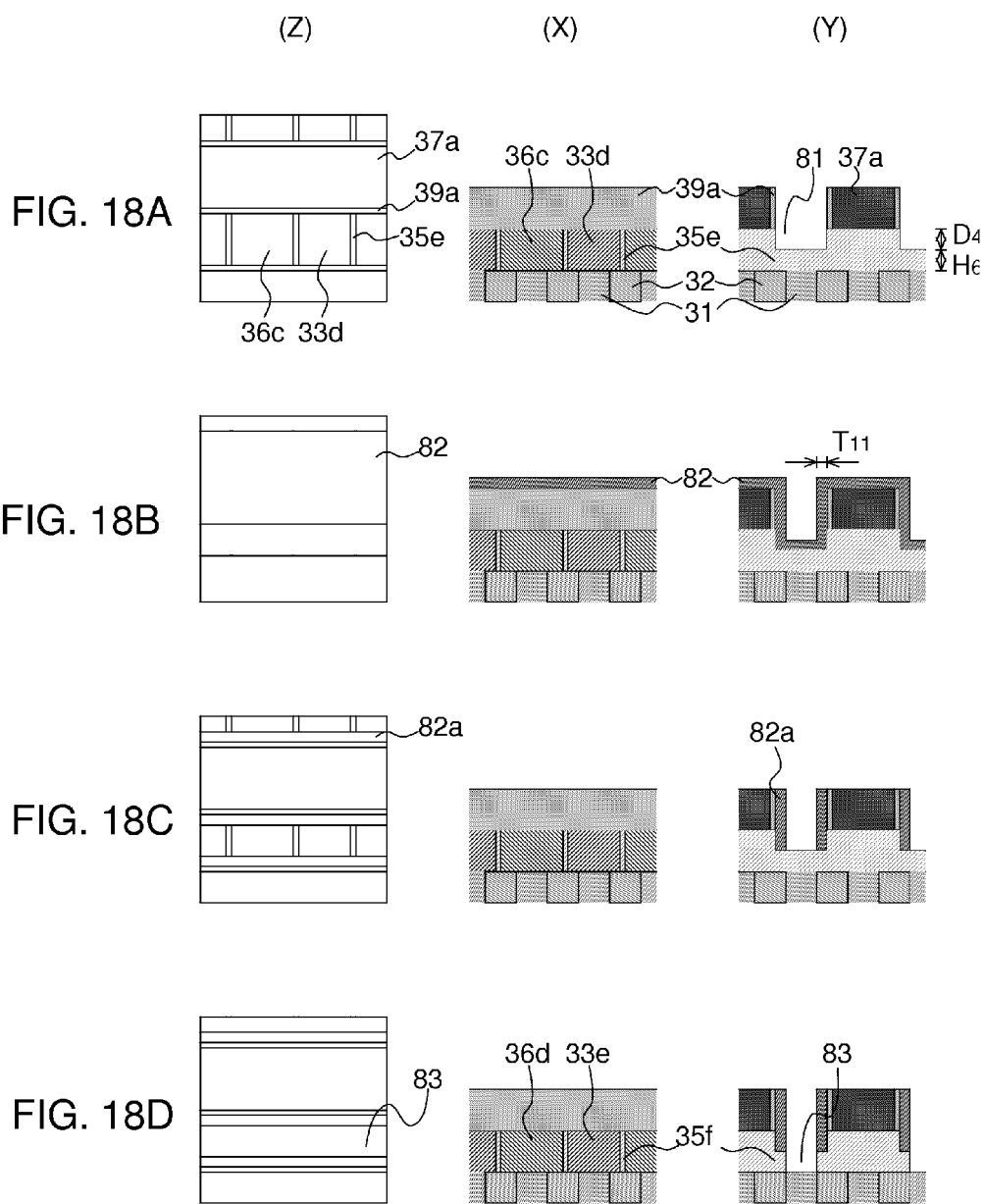

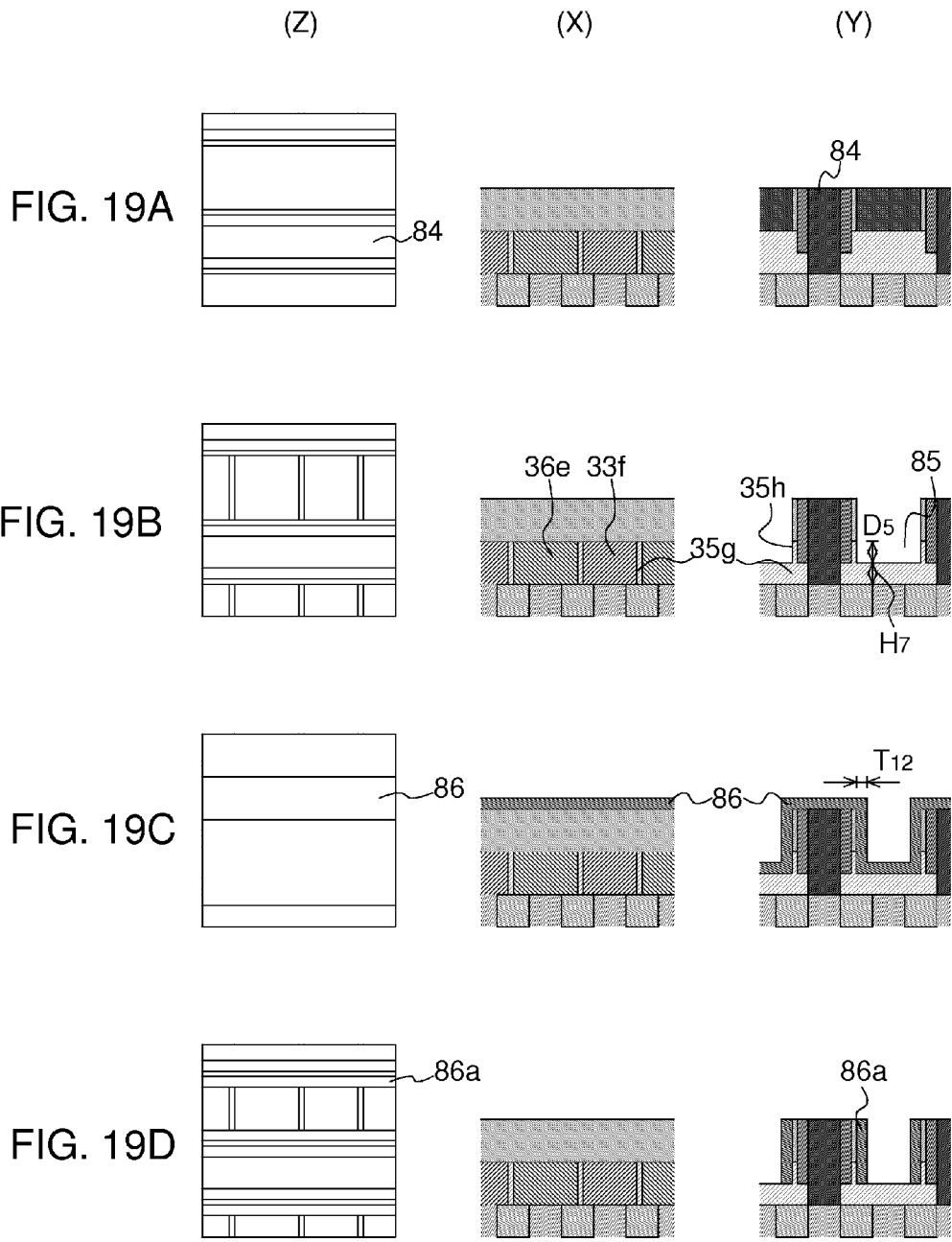

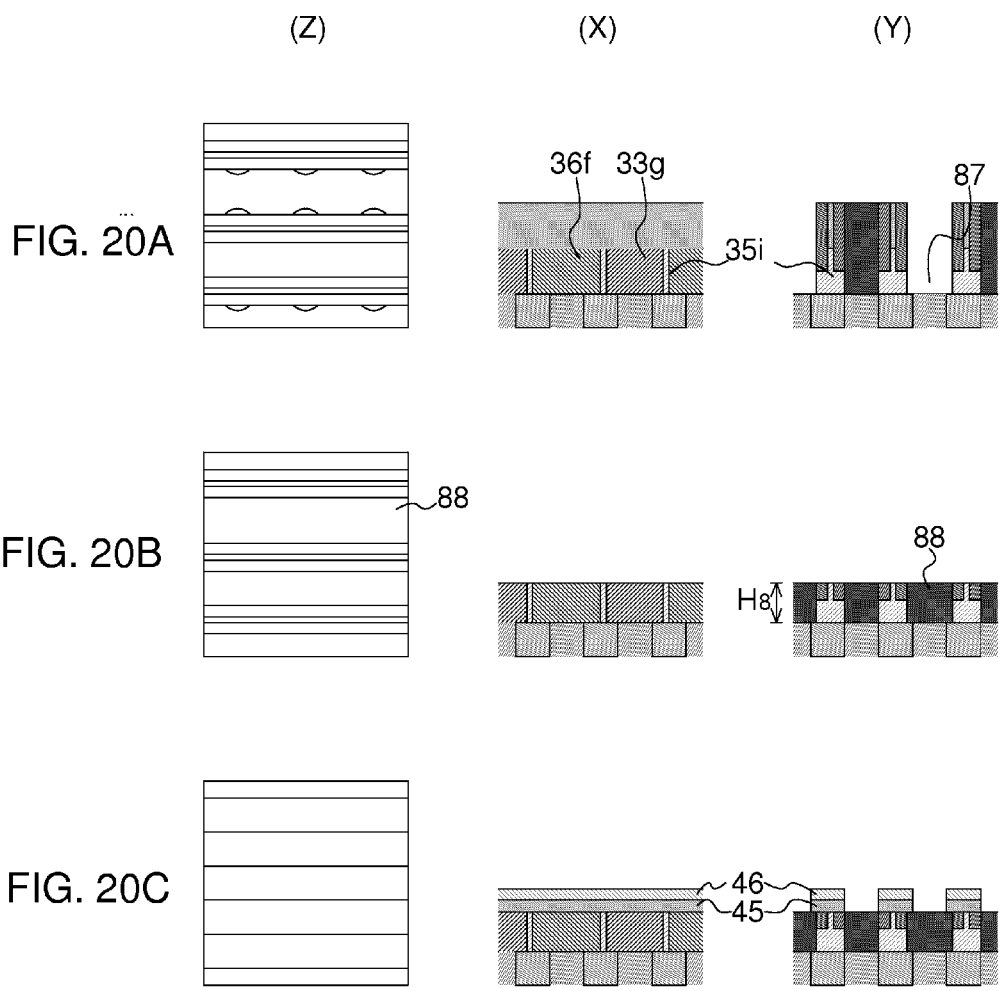

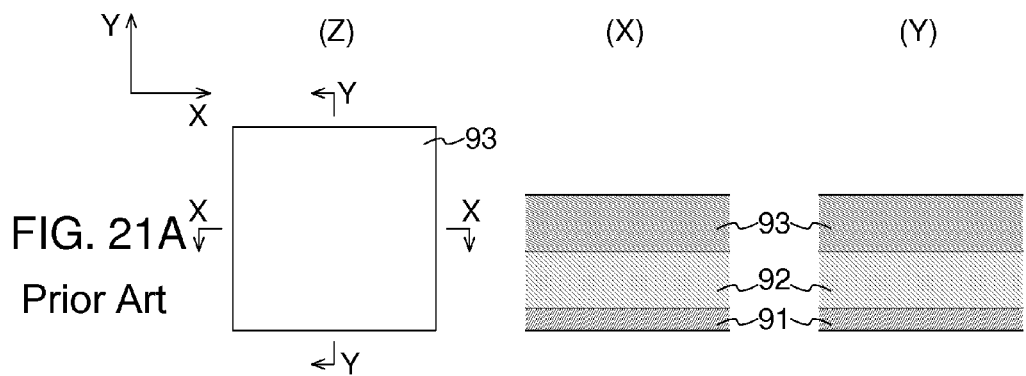
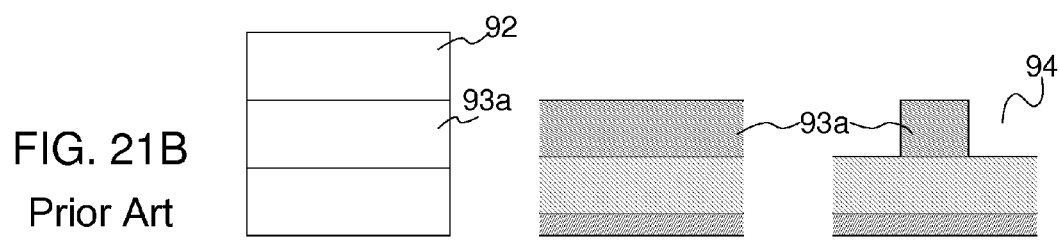
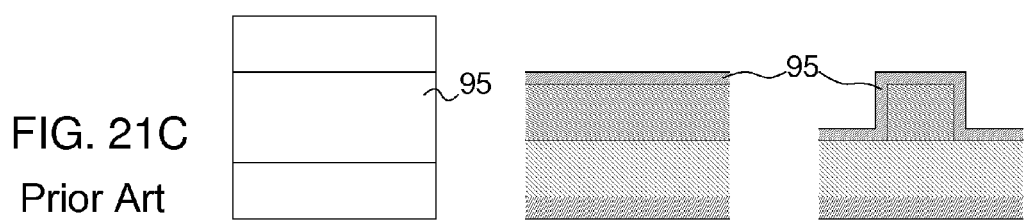
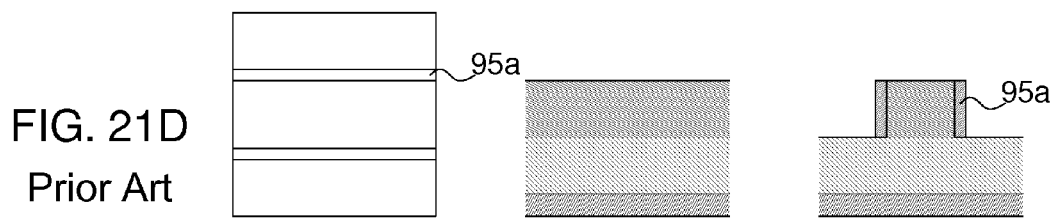

| | (Z) | (X) | (Y) |
|---|---|---|---|
| FIG. 22A Prior Art | | | |
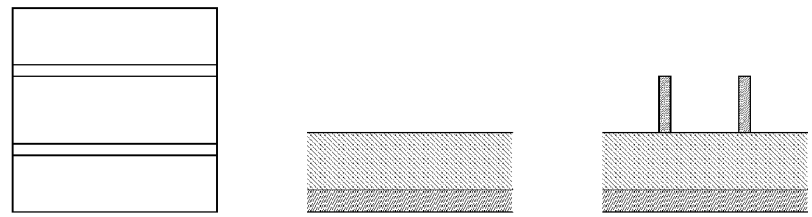
FIG. 22B Prior Art
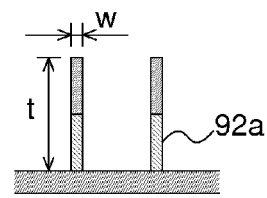
FIG. 22C Prior Art
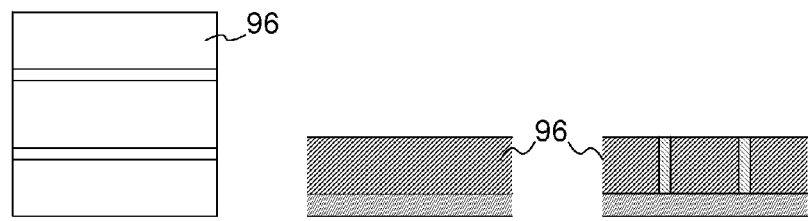

METHOD OF MANUFACTURING SEMICONDUCTOR DEVICE

TECHNICAL FIELD

This application is based upon and claims the benefit of the priority of Japanese patent application No. 2011-145126, filed on Jun. 30, 2011, the disclosure of which is incorporated herein in its entirety by reference thereto.

The present disclosure relates to a method of manufacturing a semiconductor device having a minute pattern.

BACKGROUND

In recent years, as a semiconductor device has been downsized, a double patterning technology has been developed. The double patterning technology is a technology for forming a minute circuit pattern, in which the circuit pattern to be formed is separated into two parts followed by exposure. As the double patterning technology, a method of forming a minute pattern using a sidewall as an etching mask has been known (see Japanese Patent Kokai Publication No. JP2001-156283A (Patent Document 1), for example).

FIGS. 21A to 22C illustrate schematic flowcharts (including figures corresponding to FIGS. 1(a)-(f) of Patent Document 1) to explain a method of forming a minute pattern according to a background art. In FIGS. 21A to 22C, (Z) figures on a left side are schematic top views of a semiconductor device. At the upper left of FIG. 21A, directions in the (Z) figures are shown. In the (Z) figures, a lateral (horizontal) direction corresponds to X axis, a vertical direction corresponds to Y axis, and a perpendicular direction to the surface corresponds to Z axis. The (X) figures at the central are schematic cross-sections along an X-X line of the (Z) figure on the left side, and the (Y) figures on the right side are schematic cross-sections along a Y-Y line of the (Z) figure. In FIG. 21A, a semiconductor substrate 91, a processing target layer 92 and a first dielectric interlayer 93 are stacked. Here, the background art will be explained giving an example of a method of forming the minute pattern of the processing target layer 92.

First, the first dielectric interlayer 93 is etched to make openings 94 on both sides, and therefore a dielectric interlayer line 93a is formed (FIG. 21B). Next, an etching mask layer 95 is formed on the processing target layer 92 and the dielectric interlayer line 93a (FIG. 21C). Next, sidewalls of the dielectric interlayer line 93a are formed by etching-back of the etching mask layer 95 (FIG. 21D). These sidewalls serve as etching masks 95a along side surfaces of the dielectric interlayer line 93a. Next, the dielectric interlayer line 93a between two etching masks 95a is removed by etching (FIG. 22A). Next, minute patterns 92a are formed by etching the processing target layer 92 using the etching masks 95a as masks (FIG. 22B). Lastly, the etching masks 95a are removed, and a second dielectric interlayer 96 is formed around the minute patterns (FIG. 22C).

The following analysis is given in view of the present disclosure.

In the method illustrated in FIGS. 21-22, as described in Patent Document 1, the etching mask 95a exists on the minute pattern 92a in the state illustrated in FIG. 22B. Because the thickness of the minute pattern 92a is equal to the thickness of the processing target layer 92, and the etching mask 95a is formed as the sidewall of the first dielectric interlayer 93, a total thickness t of the minute pattern 92a and etching mask 95a depends on a thickness of each layer (200 nm of the total thickness t, for example). Accordingly, the narrower the width w of the minute pattern 92a becomes (10 nm-30 nm of the width w, for example), the higher an aspect ratio (7 to 20 in the above example of the thickness t and width w, for example) of the combination pattern of the minute pattern 92a and etching mask 95a becomes.

Therefore, there is a probability that a combination pattern of the minute pattern 92a and the etching mask 95a becomes unstable so as to fall down. This may happen also in a state where only the etching mask is present as illustrated in FIG. 22A.

SUMMARY

According to a first aspect of the disclosure, there is provided a method of manufacturing a semiconductor device comprising: forming a processing target; forming a first supporter on the processing target; forming a first mask so as to contact one side surface of the first mask with a side surface of the first supporter; patterning the processing target with masks of the first mask and the first supporter; forming a second supporter so as to be contacted with a side surface of the processing target that is exposed in the first processing step and the other side surface of the first mask; removing the first supporter; and patterning the processing target with the first mask and the second supporter.

BRIEF DESCRIPTION OF THE DRAWINGS

FIGS. 12A to 12D are schematic flowcharts to explain the method of manufacturing the semiconductor device according to the third exemplary embodiment of the present disclosure.

FIGS. 13A to 13D are schematic flowcharts to explain the method of manufacturing the semiconductor device according to the third exemplary embodiment of the present disclosure.

FIGS. 18A to 18D are schematic flowcharts to explain the method of manufacturing the semiconductor device according to the fifth exemplary embodiment of the present disclosure.

FIGS. 19A to 19D are schematic flowcharts to explain the method of manufacturing the semiconductor device according to the fifth exemplary embodiment of the present disclosure.

FIGS. 20A to 20C are schematic flowcharts to explain the method of manufacturing the semiconductor device according to the fifth exemplary embodiment of the present disclosure.

FIGS. 21A to 21D are schematic flowcharts to explain a background art.

FIGS. 22A to 22C are schematic flowcharts to explain the background art.

PREFERRED EXAMPLES

The disclosure will be now described herein with reference to illustrative exemplary embodiments. Those skilled in the art will recognize that many alternative exemplary embodiments can be accomplished using the teachings of the present disclosure and that the disclosure is not limited to the exemplary embodiments illustrated for explanatory purposes. Symbols are appended merely to make the understanding easy but not intended to limit the present disclosure to illustrated modes.

First Exemplary Embodiment

Figure 1:
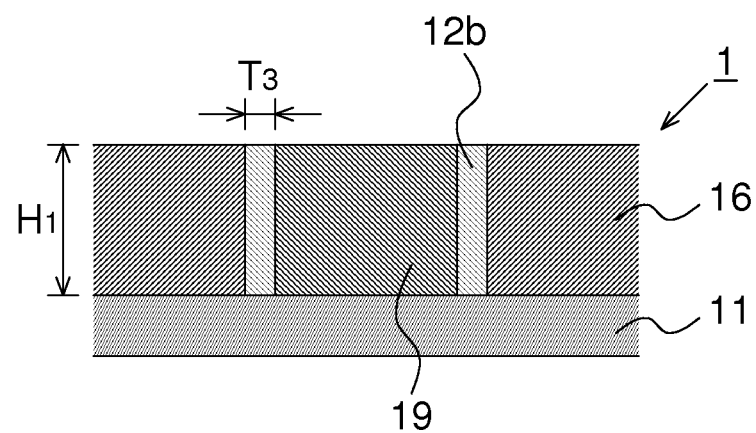
FIG. 1 is a schematic cross-sectional view of a semiconductor device to be manufactured by a method of manufacturing a semiconductor device according to a first exemplary embodiment of the present disclosure.

A method of manufacturing a semiconductor device according to a first exemplary embodiment of the present disclosure will be explained. First, the semiconductor device to be manufactured by the method of manufacturing the semiconductor device according to the first exemplary embodiment of the present disclosure will be explained. FIG. 1 illustrates a schematic cross-sectional view of a semiconductor device to be manufactured by the method of manufacturing a semiconductor device according to the first exemplary embodiment of the present disclosure. The semiconductor device 1 comprises a semiconductor substrate 11, a first material layer fins 12b formed on the semiconductor substrate 11 as a minute pattern, and a first filling layer 16 and second filling layer 19 formed around the first material layer fins 12b on the semiconductor substrate 11. In the mode illustrated in FIG. 1, two first material layer fins 12b are formed. Width $T_3$ of the first material layer fin 12b is lower in relation with height $H_1$, and an aspect ratio becomes high (3 or more of $H_1/T_3$, for example). The first material layer fins 12b, which are formed as a set of two fins in the Y direction, may have 10 nm in width $T_3$ and 40 nm in height $H_1$ at an interval of 50 nm in the Y direction.

Next, the method of manufacturing the semiconductor device 1 will be explained. FIGS. 2-4 are schematic flowcharts to explain the method of manufacturing the semiconductor device according to the first exemplary embodiment of the present disclosure. In FIG. 21 and others, (Z) figures on the left side are schematic top plan views of the semiconductor device. At the upper left of FIG. 2A, directions in the (Z) figures are shown. In the (Z) figures, a lateral direction corresponds to the X axis, a lengthwise direction corresponds to the Y axis, and a perpendicular direction to the surface corresponds to the Z axis. The (X) figures at the central are schematic cross-sections along the X-X line of the (Z) figure on the left side, and the (Y) figures on the right side are schematic cross-sections along the Y-Y line of the (Z) figure.

First, the semiconductor substrate 11 is prepared. Next, a first material layer 12 having a thickness $T_1$, which serves as a base of a minute pattern (a fin-like body having minute width, for example), is formed on the semiconductor substrate 11. As a material of the first material layer 12, a metal, semiconductor, insulator and the like may be used. When the semiconductor device 11 in which the first material layer fin 12b illustrated in FIG. 1 serves as an electrode is manufactured, for example, the first material layer 12 may be formed of titanium nitride having 50 nm in thickness $T_1$.

Figure 2A:
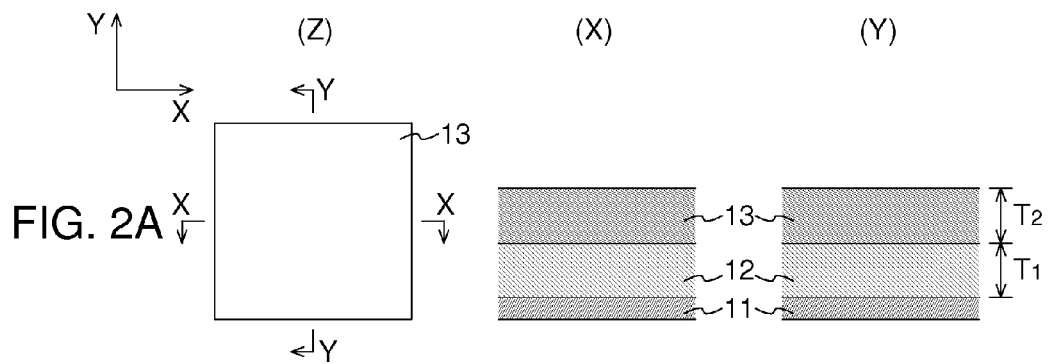
FIGS. 2A to 2D are schematic flowcharts to explain the method of manufacturing the semiconductor device according to the first exemplary embodiment of the present disclosure.

Next, a first mask layer 13 having a thickness $T_2$ is formed on the first material layer 12 (FIG. 2A). The first mask layer 13 serves as a base to form a second mask layer. As the first mask layer 13, silicon oxide having 50 nm in thickness $T_2$ may be used. The thickness $T_2$ corresponds to a height of a second mask layer sidewall 15a described below. Therefore, it is preferred that the thickness $T_2$ is set to an enough height that the second mask layer sidewall 15a serves as a mask and, for example, that the second mask layer sidewall 15a can function as a mask even if the thickness is reduced by etching.

Figure 2B:
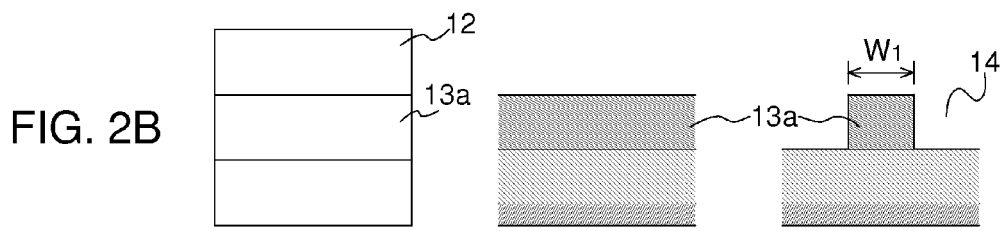

Next, a resist mask to process the first mask layer 13 is formed on the first mask layer 13 (not illustrated). Next, using this resist mask, the first mask layer 13 is partially removed by etching to form first openings 14, and therefore a first mask layer line 13a having a line-like (band-like) shape is formed. Next, the resist mask on the first mask layer 13 is removed (FIG. 2B). In the mode illustrated in FIGS. 2A-D, the first mask layer line 13a extends in the X direction (see the direction diagram at the upper left of FIG. 2A) and has a width $W_1$ in the Y direction. The width of the resist mask in the Y direction corresponds to the width $W_1$ of the first mask layer line 13a. The width $W_1$ also corresponds to a gap between two first material layer fins 12b illustrated in FIG. 1. The first mask layer 13 may have 50 nm in width $W_1$, for example.

Figure 2C:
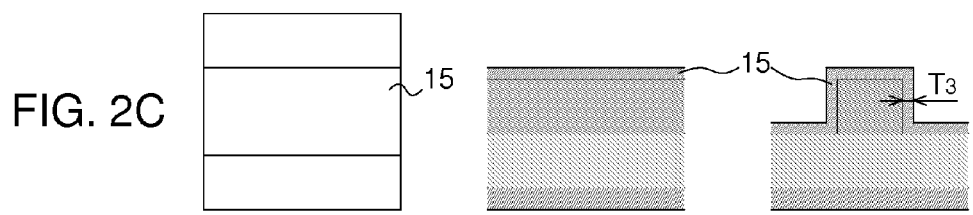

Next, the second mask layer 15 that serves as a base of a mask to process the first material layer 12 is formed. The second mask layer 15 is formed along an exposed surface of the first material layer 12 and the side and top surfaces of the first mask layer line 13a so that openings 14 are not filled and so that the first mask layer line 13a is covered (FIG. 2C). As a material of the second mask layer 15, a material capable of serving as a mask to process the first material layer 12 may be used. In this exemplary embodiment, the second mask layer 15 may be formed of tungsten, for example. The second mask layer 15 may have 10 nm in thickness $T_3$, for example. The thickness $T_3$ of the second mask layer 15 corresponds to the width of the first material layer fin 12b illustrated in FIG. 1. Accordingly, it is preferred that the thickness $T_3$ of the second mask layer 15 is set corresponding to the width of the first material layer 12 to be shaped.

Figure 2D:
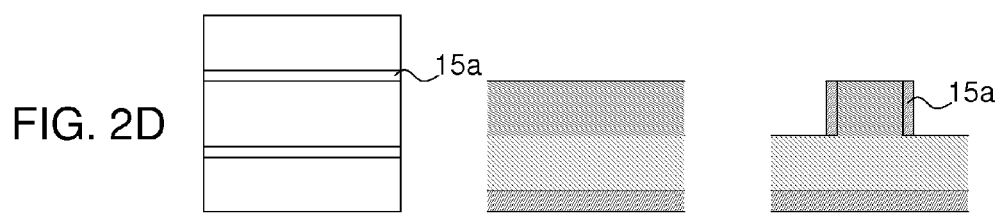

Next, by etching-back of the second mask layer 15, a top surface of the first material layer 12 and a top surface of the first mask layer line 13a are exposed, and second mask layer sidewalls 15a extending along the side surfaces of the first mask layer line 13a in the X direction and having the width $T_3$ and height $T_2$ is formed (FIG. 2D; First mask forming step). A pattern of the second mask layer sidewall 15a corresponds to a pattern to form the first material layer fin 12b illustrated in FIG. 1.

Figure 3A:
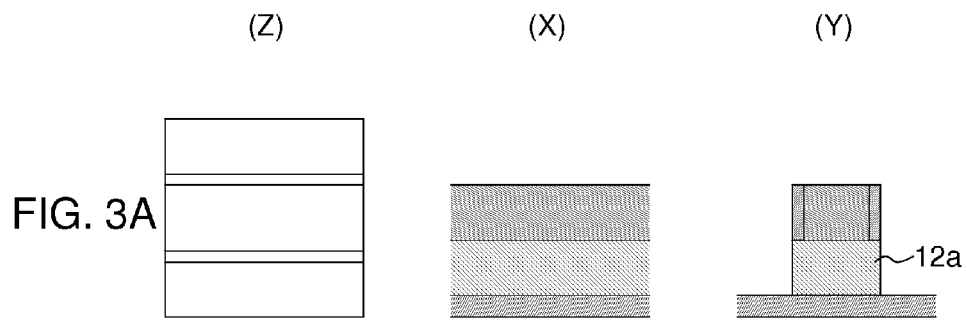
FIGS. 3A to 3D are schematic flowcharts to explain the method of manufacturing the semiconductor device according to the first exemplary embodiment of the present disclosure.

Next, using the second mask layer sidewalls 15a and first mask layer line 13a as masks, the first material layer 12 exposed in the first openings 14 is etched so as to expose the semiconductor substrate 11 (first etching), and therefore the first material layer line 12a is formed (FIG. 3A; First processing step). The first material layer line 12a has a width (W+$T_3$×2) and a height $T_2$ and extends in the X direction.

Next, a filling layer is formed so as to fill the openings 14. Next, using a CMP (Chemical Mechanical Polishing) method or the like, the filling layer on the first mask layer line 13a and second mask layer sidewalls 15a is polished and removed so as to expose the top surfaces of the first mask layer line 13a and second mask layer sidewalls 15a, and therefore a first filling layer 16 that fills the openings 14 is formed (FIG. 3B; Second supporter forming step). The first filling layer 16 may be formed by an etching-back method. As a material of the first filling layer 16, a material capable of serving as a mask to etch the first mask layer line 13a in a subsequent etching step is preferably used. In the above example, silicon nitride may be used as the material of the first filling layer 16, for example.

Figure 3B:
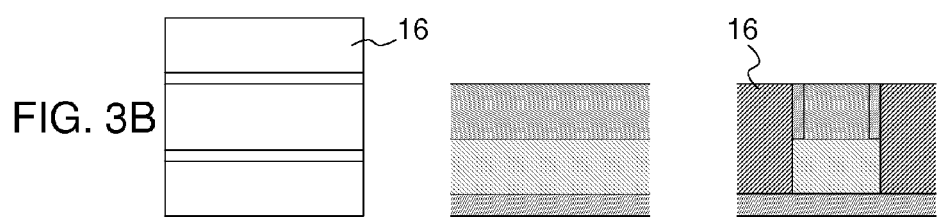
Figure 3C:
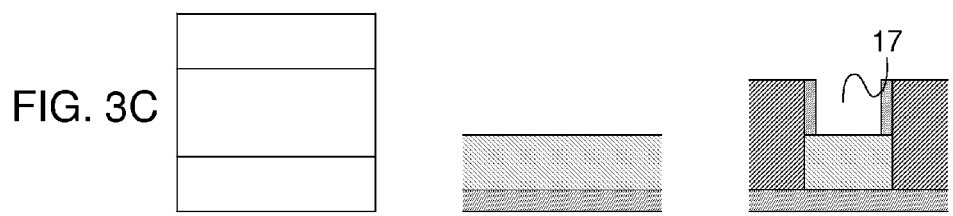

Next, using the second mask layer sidewalls 15a and first filling layer 16 as masks, the first mask layer line 13a is selectively etched and removed so as to expose the top surface of the first material layer line 12a (FIG. 3C; First supporter removing step). By removing the first mask layer line 13a, a second opening 17 is formed with the second mask layer sidewalls 15a and the first material layer line 12a.

Next, a third opening 18 is formed by partially etching the first material layer line 12a exposed from the second opening 17 so as to expose the semiconductor substrate 11 (second etching) using masks of the second mask layer sidewalls 15a and first filling layer 16. Therefore, the first material layer line 12a is processed into the first material layer fins 12b (FIG. 3D; Second processing step). That is, the first material layer 12 is processed to a fin shape having the width $T_3$ in the Y direction and height $T_1$ and extending in the X direction by transferring the pattern of the second mask layer sidewall 15a on the plane by the first etching (FIG. 3A) and second etching.

Figures 4A, 4B:
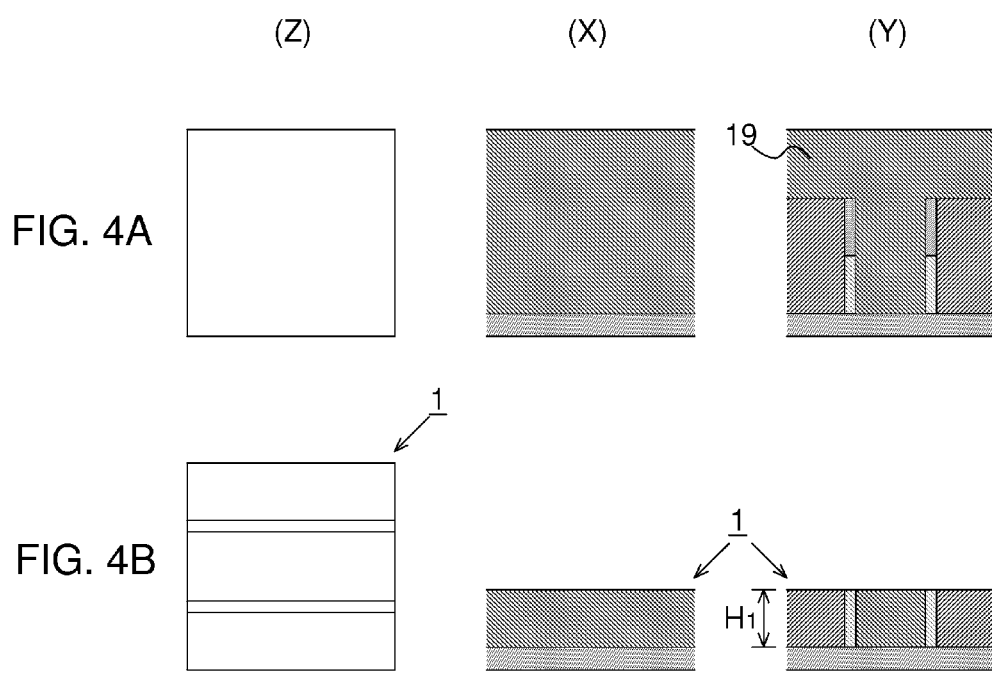
FIGS. 4A and 4B are schematic flowcharts to explain the method of manufacturing the semiconductor device according to the first exemplary embodiment of the present disclosure.

Next, a second filling layer 19 is formed, which fills at least the second opening 17 and third opening 18 (FIG. 4A; Third supporter forming step). As a material of the second filling layer 19, the same material (silicon nitride, for example) as that of the first filling layer 16 is preferably used, so that the first filling layer 16 and second filling layer 19 may be polished at once in a next CMP step.

Next, the second filling layer 19, second mask layer sidewalls 15a and first filling layer 16 are polished and removed by the CMP method to make the semiconductor device 1 (FIG. 4B; First mask removing step). This polishing and removing are performed until the second mask layer sidewalls 15a are removed and the first material layer fins 12b are exposed. In the mode illustrated in FIG. 4B, the upper part of the first material layer fins 12b are polished so that the top surfaces of the first material layer fins 12b, second filling layer 19 and first filling layer 16 are flush with one another. When the first material layer 12 has 50 nm in height $T_1$, for example, the first material layer fin 12b may have 40 nm in height $H_1$ by being polished by 10 nm in the CMP step. The second filling layer 19, second mask layer sidewalls 15a and first filling layer 16 may be removed not by the CMP method but by the etching method.

If the first material layer fin 12b to be formed has narrow width, the second mask layer sidewall 15a that serves as the etching mask has also a narrow width $T_3$. The height of the second mask layer sidewall 15a needs to keep the predetermined height $T_2$ in consideration of a thickness reduction by the etching. Accordingly, the aspect ratio of the height $T_2$ to the width $T_3$ in the second mask layer sidewall 15a can not avoid becoming higher. If only the second mask layer sidewall 15a is formed alone, there is a probability that the second mask layer sidewall 15a falls down owing to the high aspect ratio. According to the method of manufacturing the semiconductor device according to the first exemplary embodiment of the present disclosure, however, there is no possibility that the second mask layer sidewall 15a falls down even if the aspect ratio is high because any one of the side surfaces is supported. In the steps illustrated in FIGS. 2D and 3A, for example, one side surface of the second mask layer sidewall 15a is supported with the first mask layer line 13a. Accordingly, the possibility of falling down of the second mask layer sidewall 15a is decreased. In the steps illustrated in FIGS. 3C and 3D, the other side surface of the second mask layer sidewall 15a is supported with the first filling layer 16. Accordingly, the possibility of falling down of the second mask layer sidewall 15a is decreased. In the step illustrated in FIG. 3D, in particular, the first material layer fin 12b and the second mask layer sidewall 15a are stacked, and therefore a total aspect ratio becomes even higher. According to the method of manufacturing the semiconductor device according to the first exemplary embodiment of the present disclosure, however, both of the first material layer fin 12b and the second mask layer sidewall 15a are supported with the first filling layer 16. Accordingly, even after the first material layer fin 12b is formed, the possibility of falling down of the first material layer fin 12b and the second mask layer sidewall 15a can be decreased.

Second Exemplary Embodiment

Figure 5:
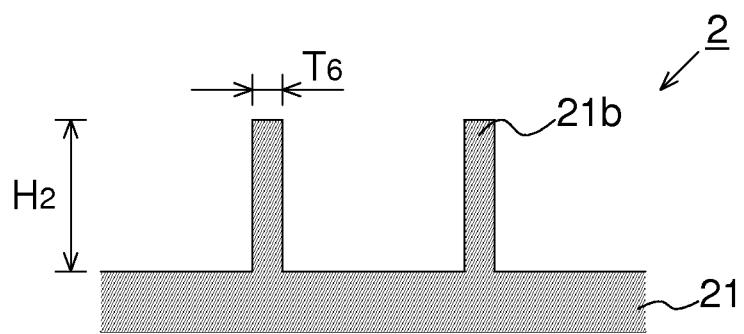
FIG. 5 is a schematic cross-sectional view of a semiconductor device to be manufactured by a method of manufacturing a semiconductor device according to a second exemplary embodiment of the present disclosure.

Next, a method of manufacturing a semiconductor device according to a second exemplary embodiment of the present disclosure will be explained. First, the semiconductor device to be manufactured by the method of manufacturing the semiconductor device according to the second exemplary embodiment of the present disclosure will be explained. FIG. 5 illustrates a schematic cross-sectional view of the semiconductor device to be manufactured by the method of manufacturing the semiconductor device according to the second exemplary embodiment. The semiconductor device 2 comprises a semiconductor substrate 21 having semiconductor substrate fins 21b. In the mode illustrated in FIG. 5, two semiconductor substrate fins 21b 12b are formed. A width $T_6$ of the semiconductor substrate fin 21b is lower in relation with height $H_2$, and an aspect ratio becomes high (3 or more in $H_2/T_6$, for example). The semiconductor substrate fins 21b, which are formed as a set of two fins in the Y direction, may have 10 nm in width $T_6$ and 50 nm in height $H_2$ at an interval of 50 nm in the Y direction, for example.

Next, the method of manufacturing the semiconductor device 2 will be explained. FIGS. 6-8 illustrate schematic flowcharts to explain the method of manufacturing the semiconductor device according to the second exemplary embodiment of the present disclosure.

Figure 6A:
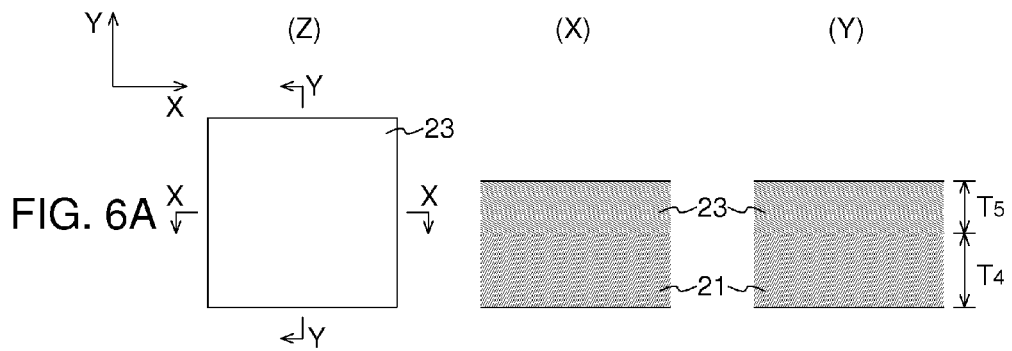
FIGS. 6A to 6D are schematic flowcharts to explain the method of manufacturing the semiconductor device according to the second exemplary embodiment of the present disclosure.

First, the semiconductor substrate 21 having a thickness $T_4$ is prepared. The thickness $T_4$ is set thicker than the height $H_2$ of the semiconductor substrate fin 21b illustrated in FIG. 5. Next, in the same way as in FIG. 2A of the first exemplary embodiment, a first mask layer 23 having a thickness $T_5$ is formed on the semiconductor substrate 21 (FIG. 6A). This mode is different in existence of the first material layer from the mode illustrated in FIG. 2A. As the first mask layer 23, silicon oxide having 50 nm in thickness $T_5$ may be used, for example.

Figure 6B:
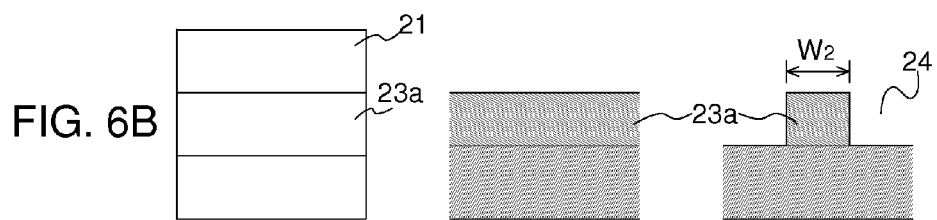

Next, in the same way as in FIG. 2B of the first exemplary embodiment, the first mask layer line 23a having a width $W_2$ is formed (FIG. 6B). First openings 24 are formed on both sides of the first mask layer line 23a. The first mask layer line 23a may have 50 nm in width $W_2$, for example.

Figure 6C:
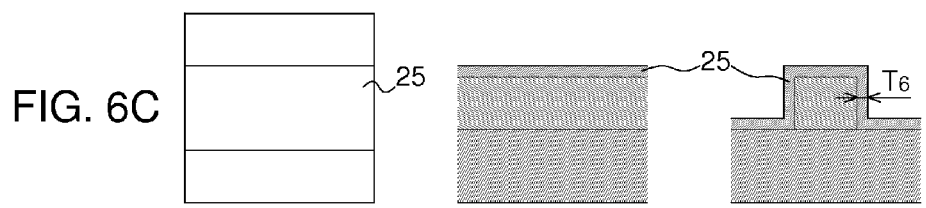

Next, in the same way as in FIG. 2C of the first exemplary embodiment, a second mask layer 25 having a thickness $T_6$ is formed (FIG. 6C). The second mask layer 25 may be tungsten having 10 nm in thickness $T_6$, for example.

Figure 6D:
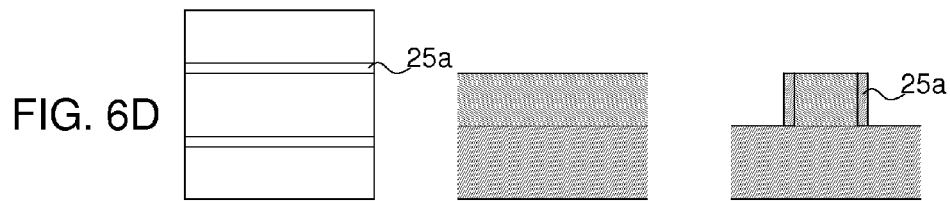

Next, in the same way as in FIG. 2D of the first exemplary embodiment, second mask layer sidewalls 25a having the width $T_6$ and thickness (i.e. height) $T_5$ is formed (FIG. 6D).

Figure 7A:
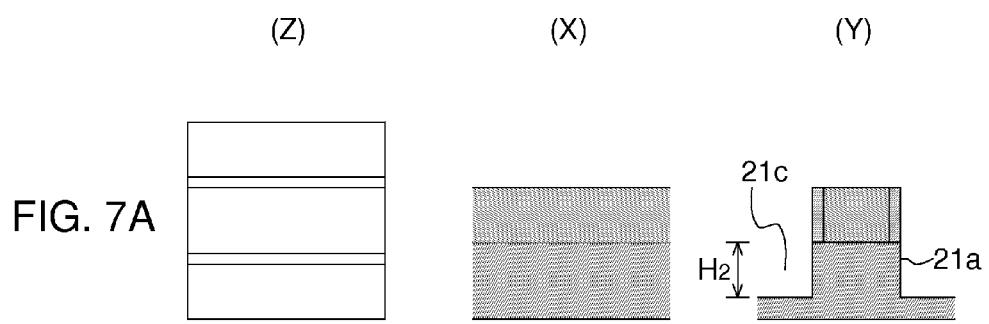
FIGS. 7A to 7D are schematic flowcharts to explain the method of manufacturing the semiconductor device according to the second exemplary embodiment of the present disclosure.
Figure 8:
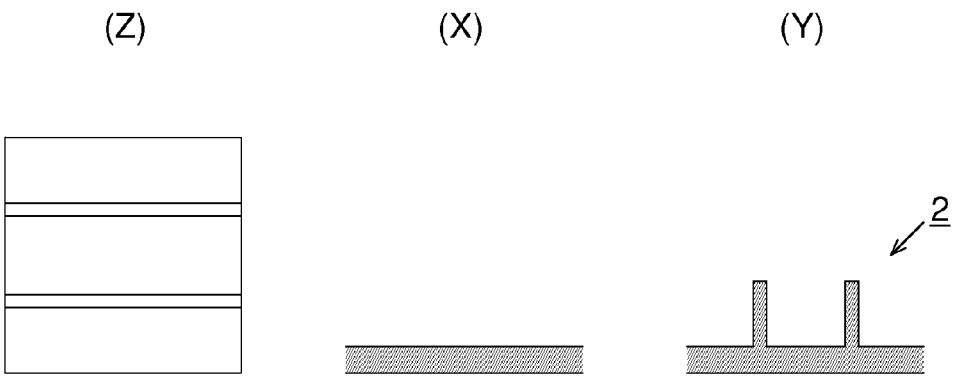
FIG. 8 is a schematic flowchart to explain the method of manufacturing the semiconductor device according to the second exemplary embodiment of the present disclosure.

Next, the semiconductor substrate 21 is partially etched using, as masks, the first mask layer line 23a and second mask layer sidewalls 25a (first etching) to form second openings 21c in the semiconductor substrate 21, and therefore a semiconductor substrate line 21a having height $H_2$ and width ($W_2+T_6\times2$) is formed (FIG. 7A). The height $H_2$ may be 50 nm, for example.

Figure 7B:
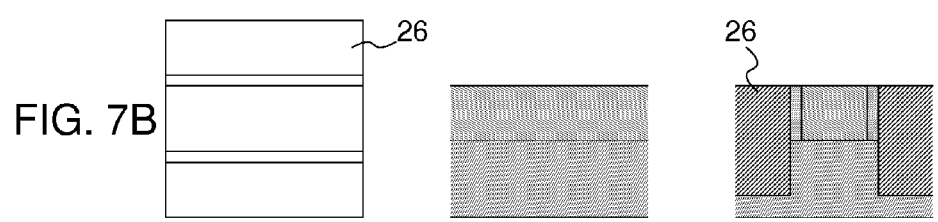

Next, in the same way as in FIG. 3B of the first exemplary embodiment, a first filling layer 26 is formed so as to fill the second openings 21c (FIG. 7B). Silicon nitride may be used as the first filling layer 26, for example.

Figure 7C:
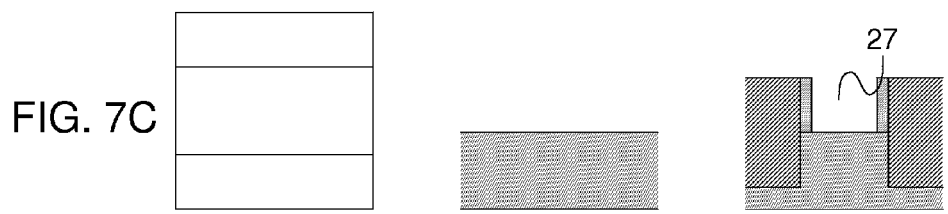

Next, in the same way as in FIG. 3C of the first exemplary embodiment, a third opening 27 is formed by electively etching and removing the first mask layer line 23a (FIG. 7C).

Figure 3D:
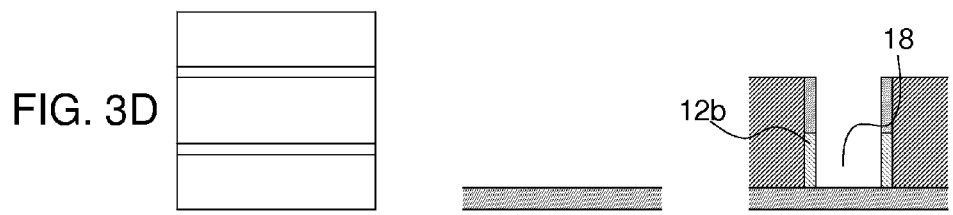
Figure 7D:
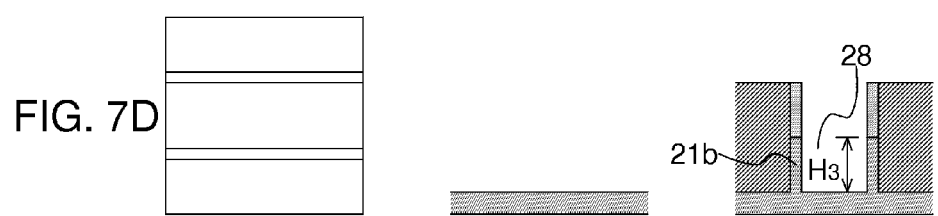

Next, in the same way as in FIG. 3D of the first exemplary embodiment, the exposed semiconductor substrate line 21a is partially etched using, as masks, the second mask layer sidewalls 25a and filling layer 26 to form a fourth opening 28 (second etching), and therefore semiconductor substrate fins 21b are formed (FIG. 7D). It is preferred that depth $H_3$ by which the semiconductor substrate 21 is etched is similar to, (same as, preferably), the height $H_2$ of the semiconductor substrate line 21a. Therefore, the semiconductor substrate fins 21b have the width $T_6$ and height $H_2$.

Next, the second mask layer sidewalls 25a and first filling layer 26 are selectively removed to expose the semiconductor substrate fins 21b, and therefore the semiconductor device 2 is manufactured (FIG. 8; First mask removing step).

According to the second exemplary embodiment, the semiconductor substrate fin 21b is monolithically formed as a part of the semiconductor substrate 21, which is different from the first exemplary embodiment, and thus the semiconductor substrate fin 21b has a structure that is hard to fall down even though the filling layer that supports the side face is removed. According to the second exemplary embodiment, in the same manner as the first exemplary embodiment, in the steps shown in FIGS. 6D, 7A, 7C and 7D, one side surface of the second mask layer sidewall 25a is supported with the first mask layer line 23a and first filling layer 26, and thus the possibility that the second mask layer sidewall 25a falls down can be decreased.

Third Exemplary Embodiment

Figure 9:
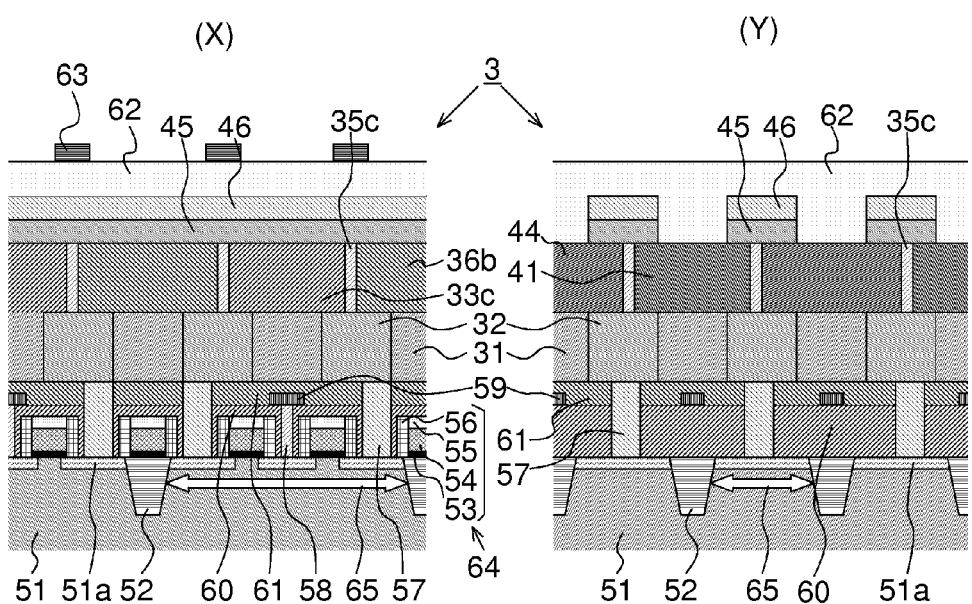
FIG. 9 is a schematic cross-sectional view of a semiconductor device to be manufactured by a method of manufacturing a semiconductor device according to a third exemplary embodiment of the present disclosure.

Next, a method of manufacturing a semiconductor device according to a third exemplary embodiment of the present disclosure will be explained. First, the semiconductor device to be manufactured by the method of manufacturing the semiconductor device according to the third exemplary embodiment of the present disclosure will be explained. FIG. 9 illustrates schematic cross-sectional views of the semiconductor device to be manufactured by the method of manufacturing the semiconductor device according to the third exemplary embodiment. Figure (X) is a schematic cross-section along the X direction and figure (Y) is a schematic cross-section along the Y direction. A semiconductor device 3 comprises a PRAM (Phase-change Random Access Memory). In detail, the semiconductor device 3 comprises: a semiconductor substrate(s) 51 having an element forming region 65 that is separated by an element isolation region(s) 52, a source/drain region(s) 51a formed in the semiconductor substrate 51, a gate electrode(s) 64 formed on the semiconductor substrate 51, a bit line(s) 59 that is electrically connected to the source/drain region(s) 51a through a bit line contact plug(s) 58 that penetrates a gate interlayer(s) 60, an electrode pad(s) 32 that is electrically connected to the source/drain region(s) 51a through an electrode contact plug(s) 57 that penetrates the gate interlayer 60 and bit line interlayer 61 and that is formed in an electrode pad interlayer 31, a first lower electrode layer pillar(s) 35c that is electrically connected to a top surface of the electrode pad 32, a first insulating layer pillar 33c and second insulating layer pillar 36b that extend, with the same width as the first lower electrode layer pillar 35c, between the first lower electrode layer pillars 35c which are adjacent to each other in the X direction, a first filling layer 41 and second filling layer 44 that fill gaps formed by the first lower electrode layer pillar(s) 35c, the first insulating layer pillar(s) 33c and the second insulating layer pillar(s) 36b, a first phase change material layer 45 that is electrically connected to the top surface of the first lower electrode layer pillar 35c, an upper electrode layer 46 formed on the first phase change material layer 45, an upper interlayer 62 that covers the first phase change material layer 45 and upper electrode layer 46, and an upper wiring (interconnect) 63 formed on the upper interlayer 62. The gate electrode 64 has a gate insulating layer 53, a gate conducting layer 54, a gate cap layer 55, and a sidewall 56.

The first lower electrode layer pillar 35c, first phase change material layer 45 and upper electrode layer 46 make up the PRAM. As the first phase change material layer 45, a material in which resistance is variable by applying heat or the like may be used, for example, and a compound including chalcogenide may be used, for example. The first lower electrode layer pillar 35c has a shape like a pillar (or column) having a quadrilateral contact surface with the first phase change material layer 45. In the PRAM of the semiconductor device 3, because the contact area between the first lower electrode layer pillar 35c and the first phase change material layer 45 is very small (10 nm×10 nm, for example), a rewriting current can be reduced. Because the first lower electrode layer pillar 35c itself has a small volume, the rewriting current can be also reduced owing to decrease of heat loss.

Next, a method of manufacturing the semiconductor device 3 will be explained. FIGS. 10-14 illustrate schematic flowcharts to explain the method of manufacturing the semiconductor device according to the third exemplary embodiment of the present disclosure.

Figure 10A:
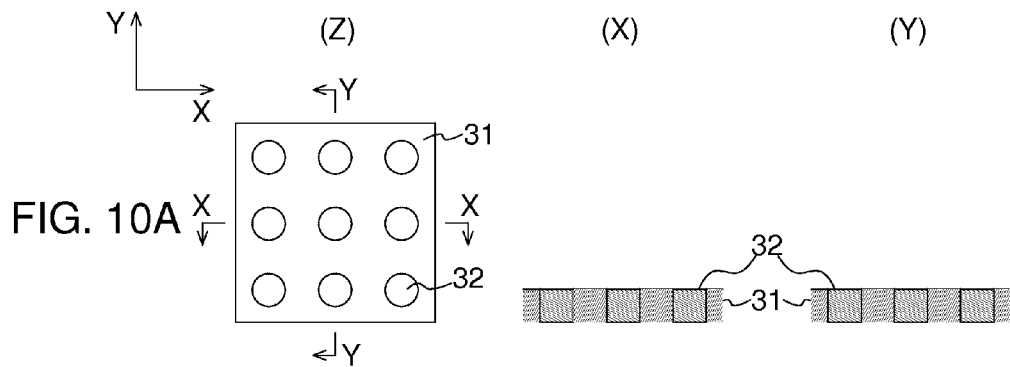
FIGS. 10A to 10D are schematic flowcharts to explain the method of manufacturing the semiconductor device according to the third exemplary embodiment of the present disclosure.

First, a manufacturing method until FIG. 10A will be explained briefly (drawings are omitted). The element isolation regions 52 are formed on the semiconductor substrate 51. The element forming regions 65 are demarcated by the element isolation regions 52. The gate electrodes 64 having the gate insulating layer 53, gate conducting layer 54, gate cap layer 55 and sidewalls 56 are formed. An impurity is introduced into the element forming regions 65 by using the gate insulating layers 53, gate conducting layers 54 and gate cap layers 55 as masks to form the source/drain regions 51a. The gate interlayer 60 is formed on the semiconductor substrate 51. The bit line contact plugs 58 that penetrate the gate interlayer 60 and that are electrically connected with the source/drain regions 51a are formed. The bit lines 59 that are electrically connected with the bit line contact plugs 58 are formed. The bit line interlayer 61 is formed on the bit lines 59. The electrode contact plugs 57 that penetrate the bit line interlayer 61 and that are electrically connected with the source/drain regions 51a are formed. The electrode pad interlayer 31 is formed on the electrode contact plugs 57. The electrode pads 32 that penetrate the electrode pad interlayer 31 and that are electrically connected with the electrode contact plugs 57 are formed (Electrode pad forming step). The electrode pads 32 are arrayed in gridlike fashion at intervals of 2F each in the X direction and Y direction with the minimum processing size F of the lithography method.

Figure 10B:
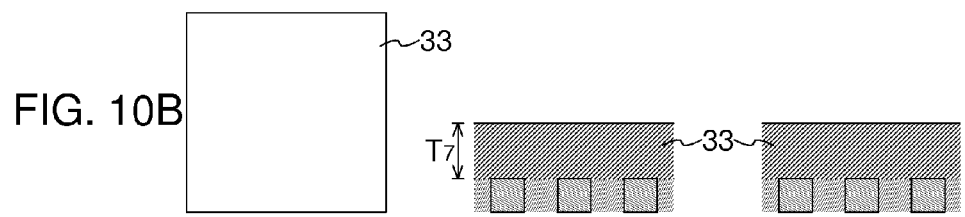

Next, a first insulating layer 33 having a thickness $T_7$ is formed on the electrode pad interlayer 31 and electrode pads 32 (FIG. 10B). The first insulating layer 33 may be silicon oxide having 60 nm in thickness $T_7$, for example.

Figure 10C:
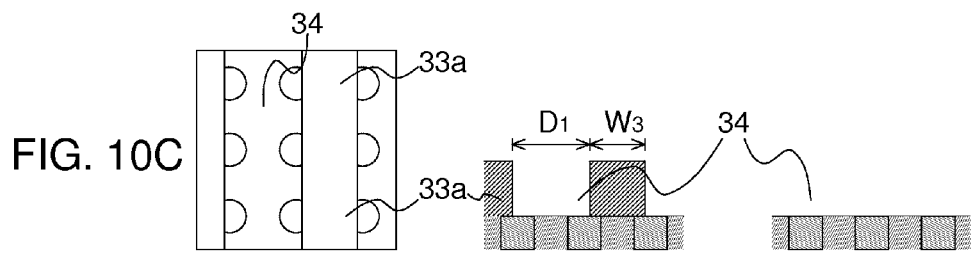

Next, in the same way as in FIG. 2B of the first exemplary embodiment, first insulating layer lines 33a having a width $W_3$ are formed by forming first openings 34 extending in the X direction (FIG. 10C; Fourth supporter forming step). The first insulating layer lines 33a extend in the Y direction and are arranged in a row at intervals of predetermined gaps in the X direction. One first insulating layer line 33a is formed between the electrode pads 32 that are adjacent to each other in the X direction, that is, along a line of the electrode pads 32 arrayed in the Y direction. Both sides of the first insulating layer line 33a approximately cover a half of each electrode pad 32. If the electrode pads 32 are arrayed in the gridlike fashion by 2F pitches, for example, the first insulating layer lines 33a are formed by 4F pitches in the X direction so as to have a distance $D_1$ of 2F.

Figure 10D:
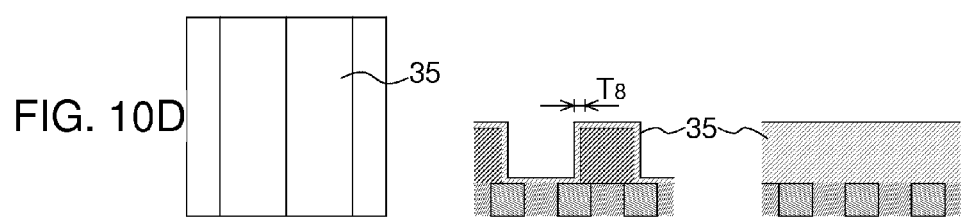

Next, in the same way as in FIG. 2C of the first exemplary embodiment, a lower electrode layer 35 having a thickness $T_8$ is formed (FIG. 10D). The lower electrode layer 35 may be titanium nitride having 10 nm in thickness $T_8$, for example.

Figure 11A:
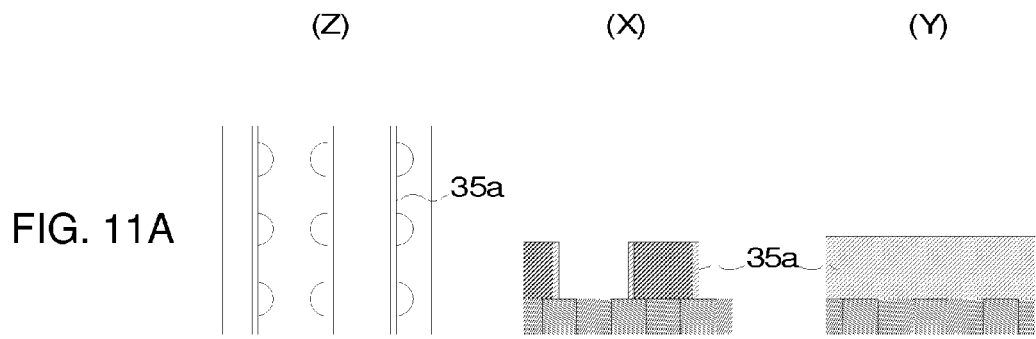
FIGS. 11A to 11D are schematic flowcharts to explain the method of manufacturing the semiconductor device according to the third exemplary embodiment of the present disclosure.

Next, in the same way as in FIG. 2D of the first exemplary embodiment, lower electrode layer fins 35a that extend in the Y direction as sidewalls of the first insulating layer line 33a are formed by etching-back of the lower electrode layer 35 so as to expose the top surfaces of the electrode pads 32 (FIG. 11A; Processing target processing step).

Figure 11B:
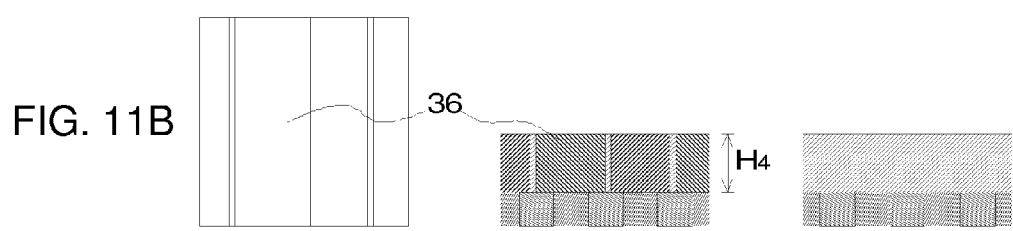

Next, a second insulating layer 36 is formed by filling an insulating layer in the first openings 34 and polishing the insulating layer with the CMP method or the like so as to expose the top surfaces of the lower electrode layer fins 35a (FIG. 11B). The upper parts of the lower electrode layer fins 35a and first insulating layer line 33a may be polished so that the top surfaces of the lower electrode layer fins 35a, first insulating layer line 33a and second insulating layer 36 become flush with one another. This can make the lower electrode layer fins 35a and others having 50 nm in height $H_4$ etc., for example.

Figure 11C:
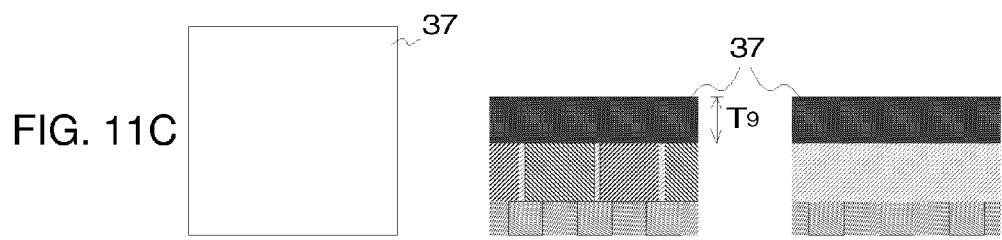

Next, in the same way as in FIG. 2A of the first exemplary embodiment, a first mask layer 37 having a thickness $T_9$ is formed on the first insulating layer 33 and others (FIG. 11C). The first mask layer 37 may be silicon oxide having 50 nm in thickness $T_9$, for example.

Figure 11D:
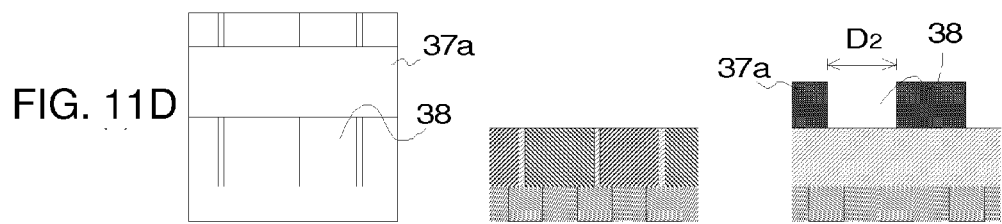

Next, in the same way as in FIG. 2B of the first exemplary embodiment, the second openings 38 are formed by etching the first mask layer 37 so as to expose the top surfaces of the lower electrode layer fins 35a, first insulating layer lines 33a and second insulating layer 36, and therefore first mask layer lines 37a are formed (FIG. 11D). The first mask layer lines 37a extend in the X direction and are arrayed in a row at intervals of predetermined gaps in the Y direction. One first mask layer line 37a is formed between the electrode pads 32 that are adjacent to each other in the Y direction, that is, along a line of the electrode pads 32 arrayed in the X direction. Both sides of the first mask layer line 37a approximately cover a half of each electrode pad 32. If the electrode pads 32 are arrayed in the gridlike fashion by 2F pitches, for example, the first mask layer lines 37a are formed by 4F pitches in the X direction so as to have a distance $D_2$ of 2F.

Next, in the same way as in FIG. 2C of the first exemplary embodiment, a second mask layer 39 having a thickness $T_{10}$ is formed on the first insulating layer 33 and others (FIG. 12A). The second mask layer 39 may be tungsten having 10 nm in thickness $T_{10}$, for example.

Next, in the same way as in FIG. 2D of the first exemplary embodiment, second mask layer sidewalls 39a are formed along the side surfaces of the first mask layer line 37a (FIG. 12B).

Next, in the same way as in FIG. 3A of the first exemplary embodiment, third openings 40 are formed by etching the lower electrode layer fins 35a, first insulating layer lines 33a and second insulating layer 36 using masks of the second mask layer sidewalls 39a and first mask layer lines 37a so as to expose the electrode pads 32 and electrode pad interlayer 31 (First etching). Therefore, the third openings 40 separate the lower electrode layer fins 35a, first insulating layer lines 33a and second insulating layer 36 that extend in the Y direction, and therefore a plurality of lower electrode layer blocks 35b, first insulating layer blocks 33b and second insulating layer blocks 36a are formed (FIG. 12C).

Next, in the same way as in FIG. 3B of the first exemplary embodiment, a first filling layer 41 is formed by forming a filling layer in the second openings 38 and third openings 40 and exposing the top surfaces of the first mask layer lines 37a and second mask layer sidewalls 39a (FIG. 12D).

Next, in the same way as in FIG. 3C of the first exemplary embodiment, fourth openings 42 are formed by selectively removing the first mask layer lines 37a so as to expose the lower electrode layer blocks 35b, first insulating layer blocks 33b and second insulating layer blocks 36a (FIG. 13A).

Next, in the same way as in FIG. 3D of the first exemplary embodiment, fifth openings 43 are formed by etching and removing the lower electrode layer blocks 35b, first insulating layer blocks 33b and second insulating layer blocks 36a, which are exposed under the fourth openings 42, using the masks of the second mask layer sidewalls 39a and first filling layer 41 so as to expose the electrode pads 32 and electrode pad interlayer 31 (Second etching). This makes the lower electrode layer blocks 35b, first insulating layer blocks 33b and second insulating layer blocks 36a having widths same as that of the second mask layer sidewalls 39a, and therefore the first lower electrode layer pillars 35c, first insulating layer pillars 33c and second insulating layer pillars 36b are formed (FIG. 13B). The formed lower electrode layer pillars 35c are shaped into a quadrangular prism having the width $T_8$ in the X direction, the width $T_{10}$ in the Y direction and the height $H_4$ as shown in FIG. 13D described below.

Next, in the same way as in FIG. 4A of the first exemplary embodiment, a second filing layer 44 is formed so as to fill the fifth openings 43 and fourth openings 42 (FIG. 13C).

Next, in the same way as in FIG. 4B of the first exemplary embodiment, the second mask layer sidewalls 39a, first filling layer 41 and second filling layer 44 are polished and removed by the CMP method so as to expose at least the top surface of the first lower electrode layer pillars 35c (FIG. 13D; First mask removing step). The upper parts of the first lower electrode layer pillars 35c may be also polished and removed. This makes the top surfaces of the first lower electrode layer pillars 35c, first filling layer 41, second filling layer 44, first insulating layer pillars 33c and second insulating layer pillars 36b flush with one another. The first lower electrode layer pillar 35c is surrounded with the first insulating layer pillar 33c, second insulating layer pillar 36b, first filling layer 41 and second filling layer 44. The first lower electrode layer pillar may have 40 nm in height $H_5$, for example.

Next, the first phase change material layers are formed on the first lower electrode layer pillars 35c (Phase change material forming step). Next, the upper electrode layers 46 are formed on the first phase change material layers 45 (FIG. 14; Conductor forming step). The first phase change material layers 45 and upper electrode layers 46 extend along lines of the electrode pads 32 arrayed in the X direction. The widths the first phase change material layer 45 and upper electrode layer 46 may be made similar to the width of the electrode pad 32 in the Y direction.

Next, the upper interlayer 62 that covers the first phase change material layers 45 and upper electrode layers 46 is formed. Peripheral contacts that are electrically connected with conducting layers, such as the source/drain region(s) 51a of the semiconductor substrate 51, gate electrode(s) 64, bit line(s) 59 and others, from the upper interlayer 62 are formed in a peripheral circuit region (not illustrated). The upper wiring 63 is formed on the peripheral contacts. An interlayer, through hole, wiring, passivation layer and the like are formed, if necessary, and the semiconductor device 3 is manufactured.

According to the third exemplary embodiment, the first lower electrode layer pillar 35c having small areas of the top and bottom surfaces, as shown in FIG. 13D, can be formed. Even if the aspect ratio of the first lower electrode layer pillar 35c is high, a possibility that each element of the first lower electrode layer pillar 35c and others falls down in the forming steps can be reduced. In FIG. 11A, one side surface of the lower electrode layer fin 35a is supported with the first insulating layer line 33a. In FIG. 12B, one side surface of the second mask layer sidewalls 39a is supported with the first mask layer line 37a. In FIG. 13A, one side surface of the second mask layer sidewall 39a is supported with the first filling layer 41. In FIG. 13B, although the first lower electrode layer pillar 35c, first insulating layer pillar 33c and second insulating layer pillar 36b have fin shapes, one side surfaces of the second mask layer sidewall 39a and the fins of the first lower electrode layer pillar 35c, first insulating layer pillar 33c and second insulating layer pillar 36b are supported with the first filling layer 41. The both sides of the first lower electrode layer pillar 35c are supported with the first insulating layer pillar 33c and second insulating layer pillar 36b. Therefore, according to this exemplary embodiment, even if each element is processed into a shape having a high aspect ratio, the possibility of falling down can be reduced, because any side surface of the element is supported with another element.

Fourth Exemplary Embodiment

Figure 15:
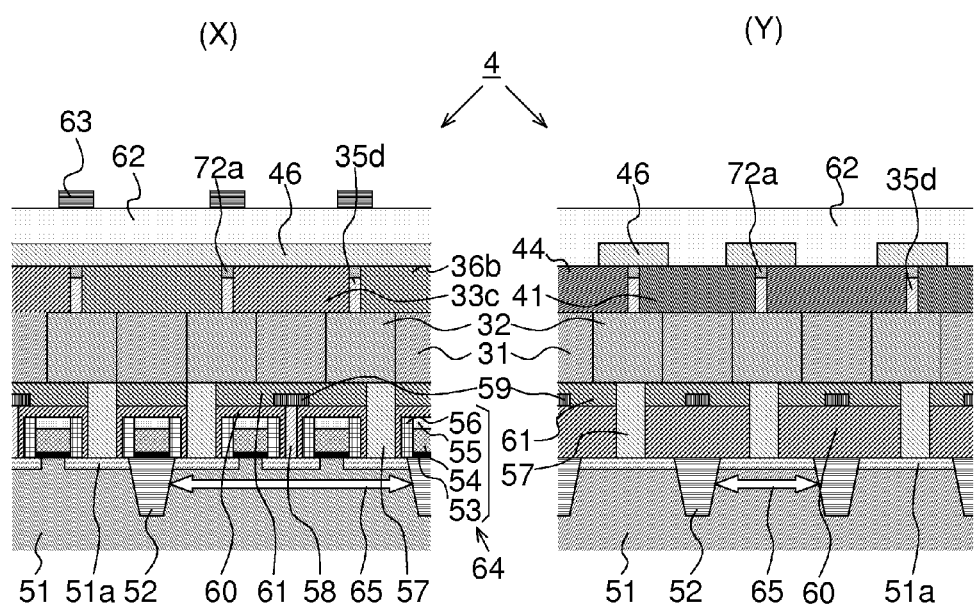
FIG. 15 is a schematic cross-sectional view of a semiconductor device to be manufactured by a method of manufacturing a semiconductor device according to a fourth exemplary embodiment of the present disclosure.
Figure 16:
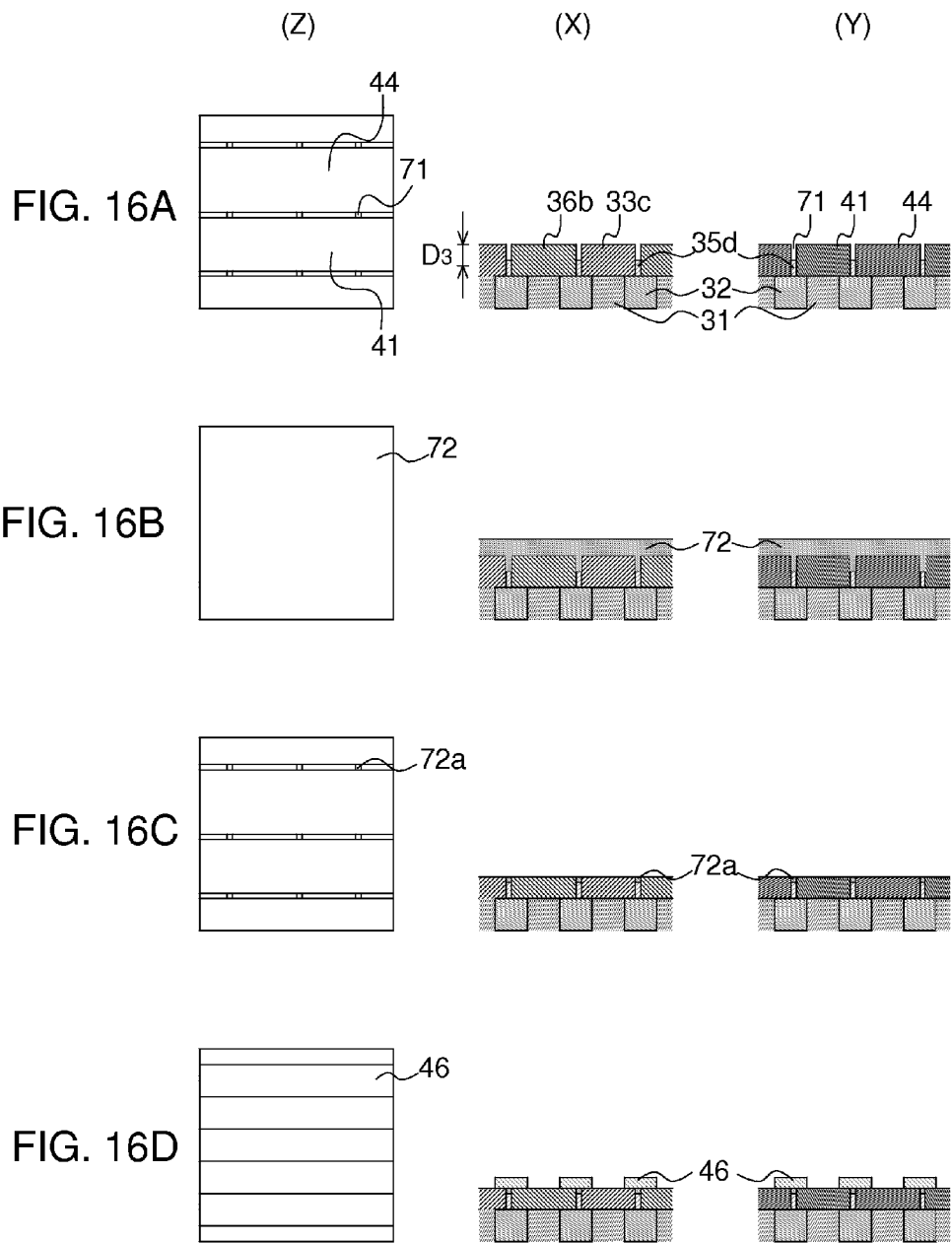
FIGS. 16A to 16D are schematic flowcharts to explain the method of manufacturing the semiconductor device according to the fourth exemplary embodiment of the present disclosure.

Next, a method of manufacturing a semiconductor device according to a fourth exemplary embodiment of the present disclosure will be explained. First, the semiconductor device to be manufactured by the method of manufacturing the semiconductor device according to the fourth exemplary embodiment of the present disclosure will be explained. FIG. 15 illustrates the schematic cross-sectional view of the semiconductor device to be manufactured by the method of manufacturing the semiconductor device according to the fourth exemplary embodiment. In FIGS. 15 and 16, same symbols are added to elements which are same as the third exemplary embodiment. In the third exemplary embodiment, the phase change material extends in a line on the lower electrode, whereas, in a semiconductor device 4 according to the fourth exemplary embodiment, a second phase change material plug 72a has a planar area similar to that of the first lower electrode layer pillar 35c. That is, the second phase change material plug 72a is made smaller than the phase change material layer in the third exemplary embodiment. Therefore, according to the semiconductor device 4, the rewriting current of the PRAM can be further decreased than the semiconductor device according to the third exemplary embodiment.

Next, a method of manufacturing the semiconductor device 4 will be explained. FIG. 16 illustrates a schematic flowchart to explain the method of manufacturing the semiconductor device according to the fourth exemplary embodiment of the present disclosure. The steps until FIG. 13D are same as the third exemplary embodiment.

After the first lower electrode layer pillars 35c are formed, upper parts of the first lower electrode layer pillars 35c are partially removed by etching to form recesses 71, and the lower electrode layer is referred to as a second lower electrode layer pillar 35d (FIG. 16A; Sixth processing step). The recess 71 may have 20 nm in depth $D_3$, for example.

Next, a second phase change material layer 72 is formed so as to fill the recesses 71 (FIG. 16B).

Next, second phase change material plugs 72a are formed by polishing the second phase change material layer 72 by the CMP method so as to expose the phase change material layer filled in the recesses 71 (FIG. 16C; Phase change material forming step).

Next, upper electrode layers 46 having a pattern are formed so as to be electrically connected with the top surfaces of the second phase change material plugs 72a (FIG. 16D; Conductor forming step). The subsequent steps are same as the third exemplary embodiment.

According to the fourth exemplary embodiment, the phase change material layer can be further made smaller than the third exemplary embodiment. Therefore, the rewriting current of the PRAM can be further reduced.

Fifth Exemplary Embodiment

Figure 17:
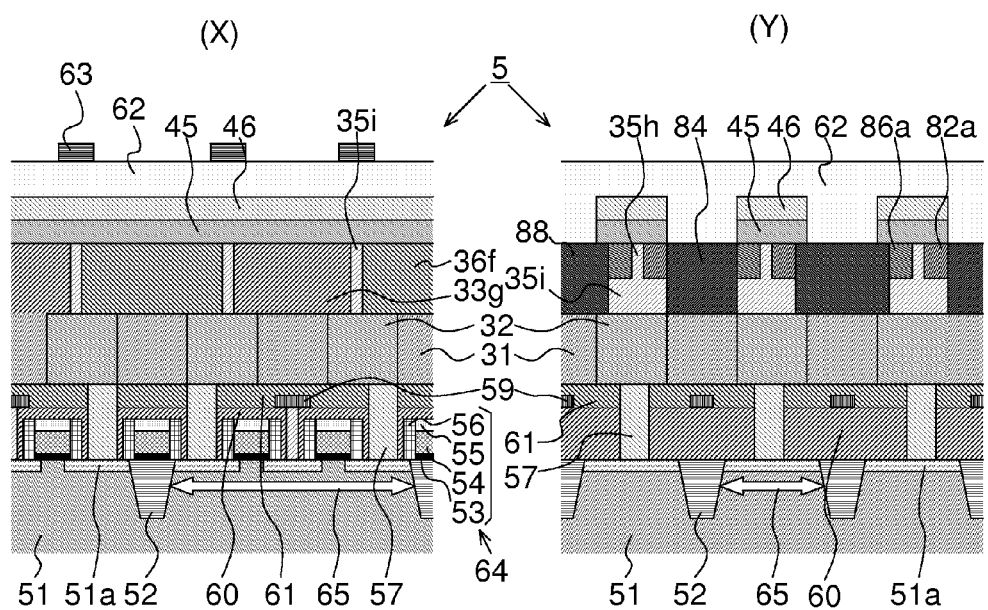
FIG. 17 is a schematic cross-sectional view of a semiconductor device to be manufactured by a method of manufacturing a semiconductor device according to a fifth exemplary embodiment of the present disclosure.

Next, a method of manufacturing a semiconductor device according to a fifth exemplary embodiment of the present disclosure will be explained. First, the semiconductor device to be manufactured by the method of manufacturing the semiconductor device according to the fifth exemplary embodiment of the present disclosure will be explained. FIG. 17 illustrates a schematic cross-sectional view of the semiconductor device to be manufactured by the method of manufacturing the semiconductor device according to the fifth exemplary embodiment. In FIGS. 17-20, same symbols are added to the elements same as the third exemplary embodiment. The lower electrode layer pillar in the third exemplary embodiment has a shape of a long and narrow quadrangular prism, whereas a lower electrode layer pillar 35i in a semiconductor device 5 according to the fifth exemplary embodiment has a convex shape on a cross section in the Y direction. That is, the lower electrode layer pillar 35i has a lower electrode layer projection 35h at the upper part that has a narrower width in the Y direction than that of the lower part, and the top surface of the lower electrode layer projection 35h is electrically connected with the first phase change material layer 45. The semiconductor device 5 has a third mask layer sidewall 82a and fourth mask layer sidewall 86a on the lower electrode layer pillar 35i except the lower electrode layer projection 35h. The lower electrode layer projection 35h is sandwiched between the third mask layer sidewall 82a and the fourth mask layer sidewall 86a.

According to this exemplary embodiment, the lower electrode layer pillar 35i has the thinner upper part and the thicker lower part. Therefore, the rewriting current can be reduced by contacting the thinned lower electrode layer projection 35h with the first phase change material layer 45, and mechanical strength can be enhanced by thickening the lower part of the lower electrode layer pillar 35i.

Next, a method of manufacturing the semiconductor device 5 will be explained. FIGS. 18-20 illustrate schematic flowcharts to explain the method of manufacturing the semiconductor device according to the fifth exemplary embodiment of the present disclosure. The steps until FIG. 12B are same as the third exemplary embodiment.

After the second mask layer sidewalls 39a are formed, sixth openings 81 are formed by partially etching the lower electrode layer fins 35a, first insulating layer lines 33a and second insulating layer 36 by using as masks, the second mask layer sidewalls 39a and first mask layer lines 37a so as not to expose the electrode pads 32 and electrode pad interlayer 31. Therefore, lower electrode layer fins 35e, first insulating layer lines 33d and second insulating layer lines 36c are formed (FIG. 18A). The lower electrode layer fins 35a and others may be polished by 30 nm in width $D_4$, and the lower electrode layer fin 35e and others may have 20 nm in a remaining height $H_6$, for example.

Next, a third mask layer 82 having a thickness $T_{11}$ is formed so as to cover the second mask layer sidewalls 39a and first mask layer lines 37a and the inner surfaces of the sixth openings 81 (FIG. 18B). As a material of the third mask layer 82, a material of a mask for etching of the first mask layer line 37a may be used. Silicon nitride may be used as the material of the third mask layer 82, for example. The third mask layer preferably has such a thickness that the sixth opening 81 is not filled and may have 15 nm in thickness $T_{11}$, for example.

Next, third mask layer sidewalls 82a are formed on the inner walls of the sixth openings 81 by etching-back of the third mask layer 82 (FIG. 18C; Second mask forming step). The third mask layer sidewall 82a extends along one side surface of the second mask layer sidewall 39a and the side surfaces of the sixth opening 81 formed with the lower electrode layer fins 35e, first insulating layer lines 33d and second insulating layer lines 36c.

Next, seventh openings 83 are formed by etching and removing the lower electrode layer fins 35e, first insulating layer lines 33d and second insulating layer lines 36c, which are exposed on the bottom of the sixth opening 81, using masks of the third mask layer sidewalls 82a, second mask layer sidewalls 39a and first mask layer lines 37a so as to expose the electrode pad interlayer 31 and electrode pads 32 (only the electrode pad interlayer 31 in FIG. 18). The seventh openings 83 separate the lower electrode layer fins 35e, first insulating layer lines 33d and second insulating layer lines 36c, which extend along in the Y direction, and therefore a plurality of lower electrode layer blocks 35f, first insulating layer blocks 33e and second insulating layer blocks 36d are formed (FIG. 18D; Third processing step). The cross sections of the lower electrode layer block 35f, first insulating layer block 33e and second insulating layer block 36d in the (Y) figure have a convex shape.

Next, a third filling layer 84 is formed by filling a filling layer in the sixth openings 81 and seventh openings 83 and polishing and removing the filling layer by the CMP method or the like so as to expose the top surfaces of the third mask layer sidewalls 82a and others (FIG. 19A; Fifth supporter forming step).

Next, the first mask layer lines 37a are selectively removed using the masks of the second mask layer sidewalls 39a, third mask layer sidewalls 82a and third filling layer 84 so as to expose the lower electrode layer blocks 35f, first insulating layer blocks 33e and second insulating layer blocks 36d (First supporter removing step). Next, in the same way as in FIG. 18A, eighth openings 85 are formed by partially etching the lower electrode layer blocks 35f, first insulating layer blocks 33e and second insulating layer blocks 36d using masks of the second mask layer sidewalls 39a, third mask layer sidewalls 82a and third filling layer 84 so as not to expose the electrode pads 32 and electrode pad interlayer 31. Therefore, lower electrode layer blocks 35g, first insulating layer blocks 33f and second insulating layer blocks 36e are formed (FIG. 19B; Fourth processing step). The lower electrode layer block 35g has lower electrode layer projections 35h, which project in a vertical direction of the substrate, under the second mask layer sidewalls 39a. It is preferred that the etching is performed so that the right and left lower electrode layer projections 35h of the lower electrode layer block 35g have the same height. That is, it is preferred that etching depth $D_5$ is same as the depth $D_4$ shown in FIG. 18A (30 nm, for example) and that height $H_7$ of the lower electrode layer block 35g in the eighth opening 85 is same as the height $H_6$ shown in FIG. 18A (20 nm, for example).

Next, in the same way as in FIG. 18B, a fourth mask layer 86 having a thickness $T_{12}$ is formed so as to cover the second mask layer sidewalls 39a, third mask layer sidewalls 82a and third filling layer 84 and the inner surfaces of the eighth openings 85 (FIG. 19C). As a material of the fourth mask layer 86, a material of the mask for the etching of the lower electrode layer block 35g can be used. Silicon nitride may be used as the material of the fourth mask layer 86, for example. The fourth mask layer 86 preferably has such a thickness $T_{12}$ that the eighth opening 85 is not filled and may have 15 nm in thickness $T_{12}$, for example.

Next, in the same way as in FIG. 18C, fourth mask layer sidewalls 86a are formed on the inner walls of the eighth opening 85 by the etching-back of the fourth mask layer 86 (FIG. 19D; Third mask forming step). The fourth mask layer sidewall 86a extends along the other side surface of the second mask layer sidewall 39a and the side surfaces of the eighth opening 85 formed with the lower electrode layer blocks 35g, first insulating layer blocks 33f and second insulating layer blocks 36e. The second mask layer sidewall 39a is sandwiched between the third mask layer sidewall 82a and the fourth mask layer sidewall 86a.

Next, in the same way as in FIG. 18D, ninth openings 87 are formed by etching and removing the lower electrode layer blocks 35g, first insulating layer blocks 33f and second insulating layer blocks 36e, which are exposed on the bottoms of the eighth openings 85, using masks of the third mask layer sidewalls 82a, second mask layer sidewalls 39a, fourth mask layer sidewalls 86a and third filling layer 84 so as to expose the electrode pad interlayer 31 and electrode pads 32. Therefore, the ninth openings 87 separate the lower electrode layer blocks 35g, first insulating layer blocks 33f and second insulating layer blocks 36e which extend in the Y direction, and therefore a plurality of lower electrode layer pillars 35i, first insulating layer pillars 33g and second insulating layer pillars 36f are formed (FIG. 20A; Fifth processing step). The cross sections of the lower electrode layer pillars 35i, first insulating layer pillars 33g and second insulating layer pillars 36f in the (Y) figure have a convex shape. There are the second mask layer sidewall 39a, third mask layer sidewalls 82a and fourth mask layer sidewalls 86a on the lower electrode layer pillar 35i.

Next, in the same way as in FIG. 19A, the eighth openings 85 and ninth openings 87 are filled with a fourth filling layer 88 (Sixth supporter forming step), and the third mask layer sidewalls 82a, second mask layer sidewalls 39a, fourth mask layer sidewalls 86a, third filling layer 84 and fourth filling layer 88 are polished by the CMP method or the like so as to expose the top surfaces of the lower electrode layer projections 35h. In order to surely expose the top surfaces of the lower electrode layer projections 35h, the upper parts of the lower electrode layer projections 35h, first insulating layer pillars 33g and second insulating layer pillars 36f may be partially polished. Therefore, the top surfaces of the lower electrode layer pillar 35i, first insulating layer pillar 33g, second insulating layer pillar 36f, third filling layer 84 and fourth filling layer 88 are made flush with one another (FIG. 20B; First mask removing step). The lower electrode layer pillar 35i may have 40 nm in thickness $H_8$, for example.

Figure 14:
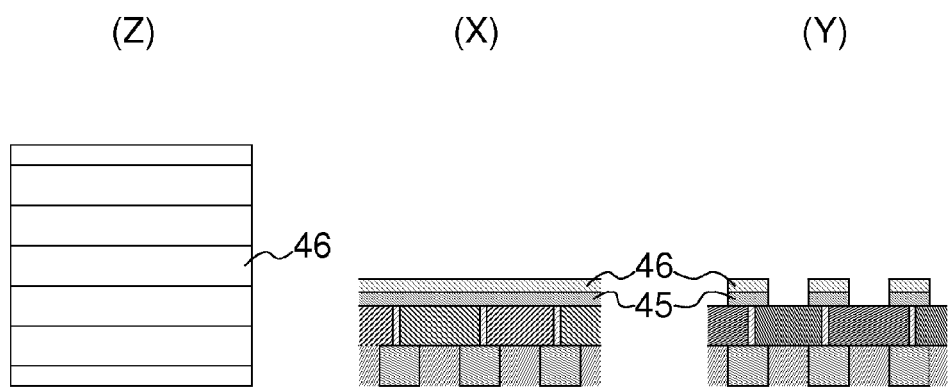
FIG. 14 is a schematic flowchart to explain the method of manufacturing the semiconductor device according to the third exemplary embodiment of the present disclosure.

Next, in the same way as in FIG. 14, the first phase change material layers 45 are formed so as to be electrically connected with the top surface of the lower electrode layer projections 35h (Phase change material forming step). Next, the upper electrode layers 46 are formed on the first phase change material layers 45 (FIG. 20C; Conductor forming step). The subsequent steps are performed same as the third exemplary embodiment, and the semiconductor device 5 is manufactured.

The method of manufacturing the semiconductor device of the present disclosure is explained based on the above exemplary embodiments, but is not limited to the above exemplary embodiments, and may include any modification, change and improvement to the exemplary embodiments within the scope of the present disclosure and based on the basic technical idea of the present disclosure. Within the scope of the claims of the present disclosure, various combinations, displacements and selections of disclosed elements are available.

A further problem, object and exemplary embodiment of the present disclosure become clear from the entire disclosure of the present invention including claims and drawings.

What is claimed is:

1. A method of manufacturing a semiconductor device, comprising:
   (a) forming a processing target;
   (b) forming a first supporter on said processing target;
   (c) forming a first mask so as to contact one side surface of said first mask with a side surface of said first supporter;
   (d) patterning said processing target using, as masks, said first mask and said first supporter;
   (e) forming a second supporter so as to be contacted with a side surface of said processing target that is exposed in the (d) and the other side surface of said first mask;
   (f) removing said first supporter; and
   (g) patterning said processing target using, as masks, said first mask and said second supporter.

2. The method according to claim 1, wherein in the (c), two masks are formed on both side surfaces of said first supporter as said first mask.

3. The method according to claim 1, wherein in the (c), said first mask is formed as a sidewall on said first supporter.

4. The method according to claim 1, further comprising: forming a third supporter that supports at least one side surface of said processing target after the (g).

5. The method according to claim 1, wherein in at least any one of the (d) and the (g), said processing target is removed from an exposed surface of said processing target to an undersurface thereof.

6. The method according to claim 1, wherein in at least any one of the (d) and the (g), an upper part of said processing target in the exposed surface is partially removed so as to leave a lower part of the processing target.

7. The method according to claim 1, further comprising:
   (h) processing said processing target into a line shape extending in a first direction before the (c); wherein in the (c), said first mask and said first supporter are processed into a line shape extending in a second direction that intersects said first direction.

8. The method according to claim 7, further comprising: forming a fourth supporter extending in said first direction before the (h); wherein in the (h), said processing target is formed as a sidewall on said fourth supporter.

9. The method according to claim 7, wherein said first direction and said second direction intersect each other at right angles.

10. The method according to claim 1, further comprising:
    (i) forming a second mask on the other surface of said first mask after the (d); and
    (j) processing said processing target using, as masks, said first mask, said first supporter and said second mask; wherein
    in the (d), an upper part of said processing target in a first exposed surface is partially removed to form a first recess in said first exposed surface of said processing target;
    in the (i), said second mask is formed so as to cover a part of a bottom of said first recess and to expose the remaining part of said bottom of said first recess; and
    in the (j), said remaining part of said processing target in said first recess is removed.

11. The method according to claim 10, further comprising:
    (k) forming a fifth supporter in a region where said processing target is removed in the (j);
    (l) removing said first supporter so as to expose said processing target;
    (m) removing a part of an upper part of said processing target in a second exposed surface so as to form a second recess in said second exposed surface of said processing target that is exposed in the (l);
    (n) forming a third mask on said one side surface of said first mask so as to cover a part of a bottom of said second recess and to expose the remaining part of said bottom of said second recess; and
    (o) removing said remaining part of said second recess of said processing target, using masks of said third mask, said first mask, said second mask and said fifth supporter.

12. The method according to claim 11, wherein
at least in the (i), said second mask is formed as a sidewall on a side surface of said first recess and said processing target and, in the (n), said third mask is formed as a sidewall on a side surface of said second recess of said first mask and said processing target.

13. The method according to claim 11, further comprising:
forming a sixth supporter in a region where said processing target is removed in the (o).

14. The method according to claim 1, wherein
said first supporter comprises silicon oxide;
said first mask comprises tungsten; and
said second supporter comprises silicon nitride.

15. The method according to claim 1, further comprising:
(p) removing said first mask so as to expose said processing target after processing said processing target.

16. The method according to claim 15, further comprising:
removing an element disposed around said processing target partially so as to make flush with a top surface of said processing target exposed in the (p).

17. The method according to claim 15, further comprising:
(q) forming a phase change material that is electrically connected with an exposed top surface of said processing target after the (p); and
(r) forming a conductor that is electrically connected with said phase change material on said phase change material; wherein
a material of said processing target comprises a conductor.

18. The method according to claim 17, further comprising:
(s) removing a part of said processing target exposed in the (p); wherein
in the (q), said phase change material is formed in a region where said processing target is removed in the (s).

19. The method according to claim 1, further comprising:
(t) forming an electrode pad before the (a); wherein
said processing target comprises a conductor; and
in the (a), said processing target is formed so as to be electrically connected with said electrode pad.

20. The method according to claim 19, wherein
in the (t), a plurality of said electrode pads are formed so as to be interspersed in a gridlike fashion; and
after the (a), said processing target is processed into a line shape extending along a line of said electrode pads arranged along a first direction.

* * * * *